United States Patent
Sumiyoshi et al.

(10) Patent No.: US 11,561,738 B2
(45) Date of Patent: Jan. 24, 2023

(54) MEMORY SYSTEM

(71) Applicant: Kioxia Corporation, Tokyo (JP)

(72) Inventors: Masato Sumiyoshi, Yokohama (JP); Keiri Nakanishi, Kawasaki (JP); Sho Kodama, Kawasaki (JP); Kohei Oikawa, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 138 days.

(21) Appl. No.: 17/191,845

(22) Filed: Mar. 4, 2021

(65) Prior Publication Data

US 2022/0083282 A1    Mar. 17, 2022

(30) Foreign Application Priority Data

Sep. 11, 2020  (JP) .............................. JP2020-153340

(51) Int. Cl.
*H03M 7/00* (2006.01)
*G06F 3/06* (2006.01)
*H03M 7/30* (2006.01)
*G11C 16/04* (2006.01)
*H03M 7/40* (2006.01)
*H03M 7/42* (2006.01)

(52) U.S. Cl.
CPC .......... *G06F 3/0661* (2013.01); *G06F 3/0608* (2013.01); *G06F 3/0673* (2013.01); *H03M 7/3088* (2013.01); *G11C 16/0483* (2013.01); *H03M 7/4062* (2013.01); *H03M 7/42* (2013.01)

(58) Field of Classification Search
CPC .... G06F 3/0661; G06F 3/0608; G06F 3/0673; H03M 7/3088; H03M 7/4062; H03M 7/42; H03M 7/6052; G11C 16/0483
USPC .......................................................... 341/106
See application file for complete search history.

(56) References Cited

U.S. PATENT DOCUMENTS

| | | | |
|---|---|---|---|
| 5,351,047 A * | 9/1994 | Behlen | G06T 9/005 341/67 |
| 5,701,468 A | 12/1997 | Benayoun et al. | |
| 5,809,176 A | 9/1998 | Yajima | |
| 6,188,338 B1 | 2/2001 | Yokose | |
| 6,792,150 B1 | 9/2004 | Satoh | |
| 10,511,324 B1 * | 12/2019 | Goyal | H03M 7/4006 |
| 2010/0195739 A1 * | 8/2010 | Lu | H03M 7/425 341/51 |
| 2018/0175890 A1 * | 6/2018 | Freudenberger | H04L 1/0045 |

* cited by examiner

*Primary Examiner* — Jean B Jeanglaude
(74) *Attorney, Agent, or Firm* — Oblon, McClelland, Maier & Neustadt, L.L.P.

(57) ABSTRACT

A memory system includes a storage device and a memory controller. The memory controller includes an encoder and a decoder. The encoder includes a first code table updating section configured to update the encoding code table and an encoding flow controlling section configured to control input to the first code table updating section by using a first data amount indicating a data amount of the input symbol. The first data amount is calculated based on the input symbol. The decoder includes a second code table updating section configured to update the decoding code table and a decoding flow controlling section configured to control input to the second code table updating section by using a second data amount indicating a data amount of the output symbol. The second data amount is calculated based on the output symbol in the same way as the calculation of the first data amount.

15 Claims, 18 Drawing Sheets

| Code | Entry ID | Symbol | Freq. |
|------|----------|--------|-------|
| 0 | 0 | A | 10 |
| 10 | 1 | B | 9 |
| 1100 | 2 | C | 8 |
| 1101 | 3 | D | 7 |
| 1110 | 4 | E | 6 |
| 1111 | 5 | F | 5 |

| Entry ID | Code | Freq. | Sym. |
|---|---|---|---|
| 0 | 0 | 10 | A |
| 1 | 10 | 9 | B |
| 2 | 1100 | 8 | C |
| 3 | 1101 | 8 | D |
| 4 | 1110 | 6 | E |
| 5 | 1111 | 5 | F |

520B

| Entry ID | Code | Freq. | Sym. |
|---|---|---|---|
| 0 | 0 | 10 | A |
| 1 | 10 | 9 | B |
| 2 | 1100 | 9 | D |
| 3 | 1101 | 8 | C |
| 4 | 1110 | 6 | E |
| 5 | 1111 | 5 | F |

530B

| Entry ID | Code | Freq. | Sym. |
|---|---|---|---|
| 0 | 0 | 10 | A |
| 1 | 10 | 10 | D |
| 2 | 1100 | 9 | B |
| 3 | 1101 | 8 | C |
| 4 | 1110 | 6 | E |
| 5 | 1111 | 5 | F |

540B

| Entry ID | Code | Freq. | Sym. |
|---|---|---|---|
| 0 | 0 | 11 | D |
| 1 | 10 | 10 | A |
| 2 | 1100 | 9 | B |
| 3 | 1101 | 8 | C |
| 4 | 1110 | 6 | E |
| 5 | 1111 | 5 | F |

550B

| Entry ID | Code | Freq. | Sym. |
|---|---|---|---|
| 0 | 0 | 12 | D |
| 1 | 10 | 10 | A |
| 2 | 1100 | 9 | B |
| 3 | 1101 | 8 | C |
| 4 | 1110 | 6 | E |
| 5 | 1111 | 5 | F |

Fig. 11

MEMORY SYSTEM

CROSS REFERENCE TO RELATED APPLICATIONS

This application is based upon and claims the benefit of priority from the prior Japanese Patent Application No. 2020-153340 filed on Sep. 11, 2020, the entire contents of which are incorporated herein by reference.

FIELD

One embodiment of the present disclosure relates to a memory system comprising a non-volatile memory.

BACKGROUND

In recent years, memory systems equipped with non-volatile memories have become widely used. As such the memory systems, a solid state drive (SSD) having NAND flash memories is known.

In the above memory system, an adaptive entropy encoding and decoding method is used. The adaptive entropy encoding method is a method of encoding data while sequentially updating an encoding table. The adaptive entropy decoding method is a method of decoding data while successively updating a decoding table. In these methods, the state of the encoding table must be reproduced correctly in the decoding table in order to correctly decode the encoded data.

BRIEF DESCRIPTION OF DRAWINGS

FIG. 10 is an example of a code table used for an entry number extraction performed in a decoder of a compression/decompression circuit according to an embodiment;

FIG. 11 is a diagram showing an example of a state transition of a code table included in an encoder or a decoder of a compression/decompression circuit according to an embodiment;

DETAILED DESCRIPTION

Figure 1:
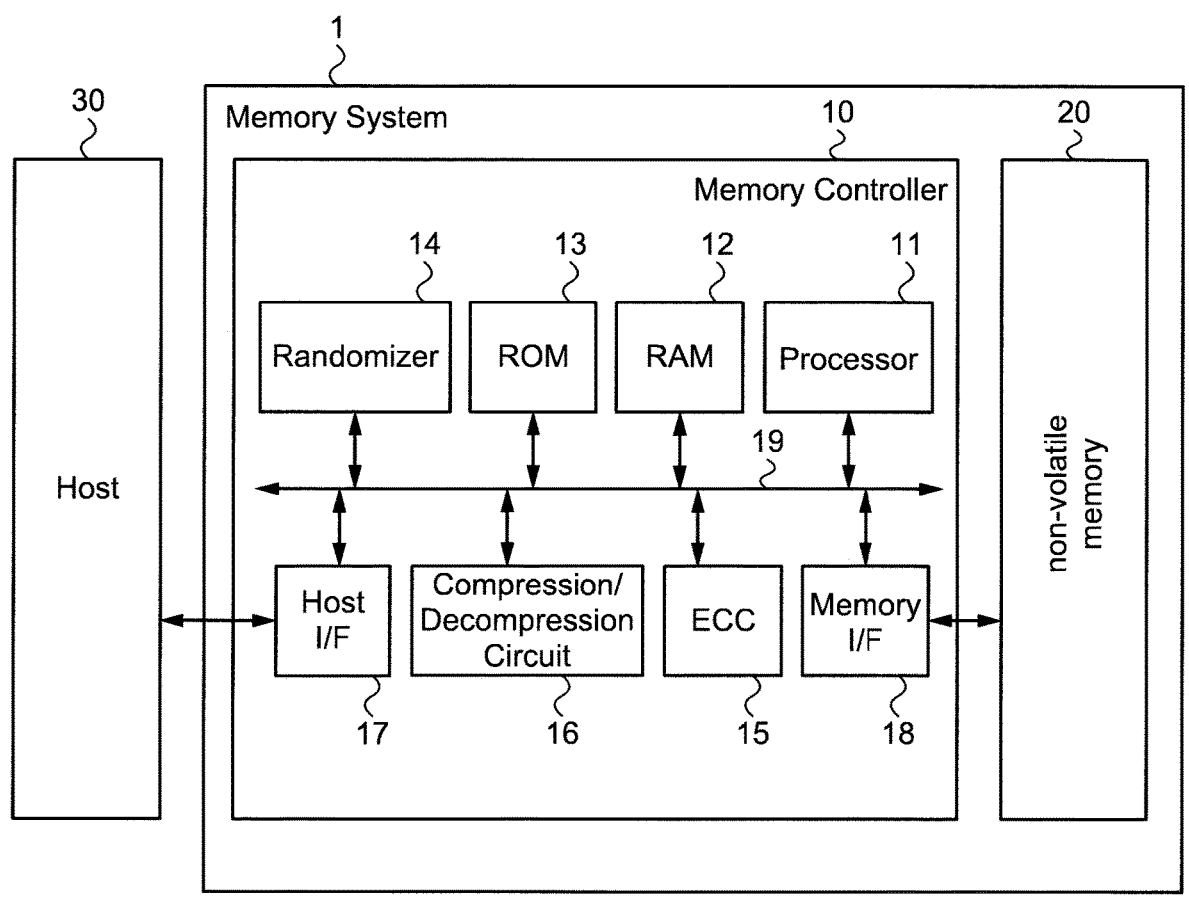
FIG. 1 is a block diagram showing a configuration of a memory system according to an embodiment.

A memory system according to an embodiment of the present disclosure improves a throughput of encoding and decoding in a compression/decompression circuit of a memory system.

A memory system in an embodiment including a storage device and a memory controller configured to control the storage device and configured to decode a compressed data. The memory controller including an encoder configured to convert an input symbol to a codeword by using an encoding code table, and a decoder configured to convert the codeword to an output symbol by using a decoding code table. The encoder including a first code table updating section configured to update the encoding code table in response to an appearance pattern of a symbol, and an encoding flow controlling section configured to control input to the first code table updating section by using a first data amount indicating a data amount of the input symbol, the first data amount being calculated based on the input symbol. The decoder including a second code table updating section configured to update the decoding code table in response to an appearance pattern of a symbol, and a decoding flow controlling section configured to control input to the second code table updating section by using a second data amount indicating a data amount of the output symbol, the second data amount being calculated based on the output symbol in the same way as the calculation of the first data amount.

Hereinafter, the memory system according to an embodiment is described in detail with reference to the drawings. In the following description, components having substantially the same functions and configurations are denoted by the same reference numerals, and duplicate descriptions are given only when necessary. Each of the embodiments described below exemplifies an apparatus and a method for embodying a technical idea of this embodiment. The technical idea of the embodiment is not specified as materials, shapes, structures, arrangements, and the like of the constituent parts described below. Various modifications may be made to the technical idea of the embodiment in addition to the scope of the claims.

In the following explanation, data having one Byte is referred to as "data". Data arranged in the order in which the data are input are referred to as "data string". However, "data" is not limited to data having one Byte. Data string input to a compression/decompression circuit 16 to be described later is referred to as "input data string". Data string output from the compression/decompression circuit16 is referred to as "output data string".

Data in which the data described above is compressed by a dictionary based compression in a dictionary based compression section 300 is referred to as a "symbol." The symbol input to an encoder 100 of the compression/decompression circuit 16 is referred to as an "input symbol". The symbol output from a decoder 200 of the compression/decompression circuit 16 is referred to as an "output symbol". When it is not necessary to distinguish between "input symbol" and "output symbol", it is simply referred to as "symbol". One "symbol" may correspond to one "data" or may correspond to compressed data in which a plurality of "data" are compressed. In the following embodiments, the symbols corresponding to uncompressed data are referred to as "literal symbols." The symbol corresponding to the compressed data is called a "match symbol".

The "Match symbol" is a symbol in which a data string of the compression target is replaced with information indicating the location where data string having the same pattern as the data string of the compression target appeared in the past and information regarding the length of data string that the data string of compression target matches a pattern appeared in the past. For example, the match symbol includes a "location information" indicating an address in a history buffer in which the previously decompressed data string is stored, and a "length information" indicating the number of data from start location in data string stored in the address.

"Compressing" means reducing the data amount (e.g., the number of bits) in the target data string. "Compressing" can also be referred to as "encoding". "Decompressing" means restoring the amount of data in the compression data string to its pre-compressed state. "Decompressing" can also be referred to as "decoding".

In the following description, one cycle of a clock signal used for control for inputting an input symbol to the encoder100, or one cycle of a clock signal used for control for outputting an output symbol from the decoder 200 referred to as "one cycle". A plurality of buffers (e.g., flip-flop circuit) are provided in the encoder 100 and the decoder 200. Data stored in a buffer is transmitted from the buffer during one cycle and stored in a following buffer. In the following embodiment, a configuration will be described in which a plurality of input symbols are input to the encoder100 in one cycle, and a configuration in which a plurality of codeword obtained by converting the plurality of input symbols are transmitted from the encoder100 in one cycle.

First Embodiment

The memory system according to a first embodiment is described. The memory system according to the first embodiment includes, for example, a NAND flash memory as a semiconductor memory device and a memory controller controlling the NAND flash memory. In this embodiment, the memory controller has a function compressing a data and decompressing a compressed data.

[Overall Configuration of Memory System 1]

FIG. 1 is a block diagram illustrating a configuration of a memory system according to an embodiment. As illustrated in FIG. 1, a memory system 1 includes a memory controller 10 and a non-volatile memory 20. The memory system 1 is connectable to a host 30. In FIG. 1, a state in which the memory system 1 and the host 30 are connected is shown. The host 30 is, for example, an electronic device such as a personal computer or a portable terminal.

The non-volatile memory 20 is a non-volatile memory that stores data in a nonvolatile manner, and is, for example, a NAND flash memory (hereinafter, simply referred to as a NAND memory). In the following explanation, the NAND memory is used as the non-volatile memory 20. However, the semiconductor memory device other than the NAND memory such as a three-dimensional flash memory, ReRAM (Resistance Random Access Memory), or FeRAM (Ferroelectric Random Access Memory) can be used as the non-volatile memory 20. It is not essential that the non-volatile memory 20 be the semiconductor memory device. The present embodiment can be applied to various storage media other than the semiconductor memory device.

The memory system 1 may be a memory card or the like in which the memory controller 10 and the non-volatile memory 20 are configured as a single package, or may be an SSD (Solid State Drive), or the like.

The memory controller 10 is, for example, a semiconductor integrated circuit configured as a SoC (System-On-a-Chip). Some or all of the operations of the respective components of the memory controller 10 described below are realized by hardware, but may be realized by executing firmware by a CPU (Central Processing Unit).

The memory controller 10 controls writing to the non-volatile memory 20 in accordance with a write request from the host 30 and controls reading from the non-volatile memory 20 in accordance with a read request from the host 30. The memory controller 10 includes a processor 11, a RAM (Random Access Memory) 12, a ROM (Read Only Memory) 13, a randomizer 14, an ECC circuit 15, a compression/decompression circuit 16, a host I/F (host interface) 17, and a memory I/F (memory interface) 18. These functional blocks are interconnected by an internal bus 19.

The compression/decompression circuit 16 operates as an encoder compressing data to be written to the non-volatile memory 20. The compression/decompression circuit 16 also operates as a decoder decompressing data read from the non-volatile memory 20. Detailed configuration and operation of the compression/decompression circuit 16 are described later.

The host I/F 17 performs operations according to the interface standard between the host 30 and the host I/F 17. The host I/F 17 outputs the request received from the host 30 and data to be written to the internal bus 19. The host I/F 17 transmits data read from the non-volatile memory 20 and decompressed by the compression/decompression circuit 16 to the host 30, and transmits responses from the processor 11 to the host 30.

The memory I/F 18 performs a write operation to non-volatile memory 20 according to the instructions from the processor 11. The memory I/F 18 performs a read operation from the non-volatile memory 20 according to the instructions from the processor 11.

The processor 11 is a control section that comprehensively controls each functional block of the memory system 1. When the processor 11 receives a request from the host 30 through the host I/F 17, the processor 11 performs control in response to the request. For example, the processor 11 instructs the memory I/F 18 to write data to the non-volatile memory 20 in response to the write request from the host 30.

The processor 11 instructs the memory I/F 18 to read data from the non-volatile memory 20 in response to the read request from the host 30.

When the processor 11 receives the write request from the host 30, the processor 11 determines the storage area (memory area) on the non-volatile memory 20 for the data to be stored in RAM 12. That is, the processor 11 manages address to which data is written. A correspondence relationship between a logical address of the data received from the host 30 and a physical address indicating the storage area on the non-volatile memory 20 in which the data are stored is stored as an address conversion table.

When the processor 11 receives the read request from the host 30, the processor 11 converts the logical address specified by the read request to the physical address using address conversion table described above, and instructs the memory I/F 18 to read from the physical address.

In the NAND memory, generally, data are written and read in units of data called pages, and erased in units of data called blocks. A plurality of memory cells connected to the same word line are called memory cell group. In the case where the memory cell is an SLC (Single Level Cell), one memory cell group corresponds to one page. In the case where the memory cell is a multi-bit cell such as an MLC, a TLC, or a QLC, one memory cell group corresponds to a plurality of pages. Each memory cell is connected to both the word line and a bit line. Thus, each memory cell can identify using an address identifying the word line and an address identifying the bit line.

The RAM 12 is used, for example, as a data buffer and temporarily stores data received from the host 30 until the memory controller 10 stores the data to the non-volatile memory 20. The RAM 12 temporarily stores the data read from the non-volatile memory 20 until it is transmitted to the host 30. For example, the RAM 12 can be used as a general purpose memory, such as an SRAM (Static Random Access Memory) or a DRAM (Dynamic Random Access Memory).

The RAM 12 may be used as a working memory storing various management tables such as an address conversion table, a master table (snapshot) that is read from a particular area of the non-volatile memory 20 and developed at a time of activation or the like, or log information which is a change difference in various management tables.

The ROM 13 records various programs, parameters, and the like to operate the memory controller 10. The programs, parameters, and the like stored in the ROM 13 are read and executed by the processor 11 as required.

The Randomizer 14 includes, for example, a linear feedback shift register and the like, and generates a pseudo-random number uniquely obtained with respect to the inputted seed values. For example, the pseudo-random number generated by randomizer 14 is calculated an exclusive OR with the write data in the processor 11. Accordingly, the write data to be written to the non-volatile memory 20 is randomized.

The data transmitted from the host 30 to host I/F 17 is transferred to the internal bus 19 and temporarily stored in RAM12. The data are compressed by the compression/decompression circuit 16 and performed an error correction encoding by the ECC circuit 15. Then, the data are written to non-volatile memory 20 via memory I/F 18. On the other hand, the data read from the non-volatile memory 20 is performed an error correction decoding by the ECC circuit 15. Thereafter, the data are decompressed by the compression/decompression circuit 16 to restore the original data. The restored data are, for example temporarily stored in RAM12 and then transferred to the host 30 via host I/F 17.

The data encoded by the compression/decompression circuit 16 and/or the ECC circuit 15 may include a control data or the like used in the memory controller 10, in addition to the data described above.

In the write process according to the memory system 1 having the above-described configuration, the processor 11 instructs the compression/decompression circuit 16 to compress the data when the data are written to the non-volatile memory 20. At this time, the processor 11 determines the storage location (storage address) of the write data in the non-volatile memory 20, and instructs the memory I/F 18 the determined storage location. The compression/decompression circuit 16 compresses the data on the RAM 12 based on the instruction from the processor 11. Further, the ECC circuit 15 ECC decodes the compressed data on the RAM 12 based on the instruction from the processor 11. The generated write data are written via the memory I/F 18 to a specified storage location in the non-volatile memory 20. As an encoding method of the ECC circuit 15, for example, an encoding method using an LDPC (Low-Density Parity-Check) code, a BCH (Bose-Chaudhuri-Hocquenghem) code, or an RS (Reed-Solomon) code can be adopted.

On the other hand, in the read process, when the processor 11 reads from the non-volatile memory 20, processor 11 specifies an address on the non-volatile memory 20 and instructs the memory I/F 18 to read. The processor 11 instructs the ECC circuit 15 to start ECC decoding, and also instructs the compression/decompression circuit 16 to start decompressing. The memory I/F 18 executes a read to the specified addresses of the non-volatile memory 20 in accordance with the instruction from the processor 11, and inputs the read data obtained by the read process to the ECC-circuit 15. The ECC circuit 15 ECC decodes the input read data. The compression/decompression circuit 16 decompress the ECC decoded data. When this decompression is successful, the processor 11 stores the decompressed originals in the RAM 12. On the other hand, when the ECC decoding and decompression fail, the processor 11, for example, notifies the host 30 of a read error.

[Configuration of the Compression/Decompression Circuit 16]

Figure 2:
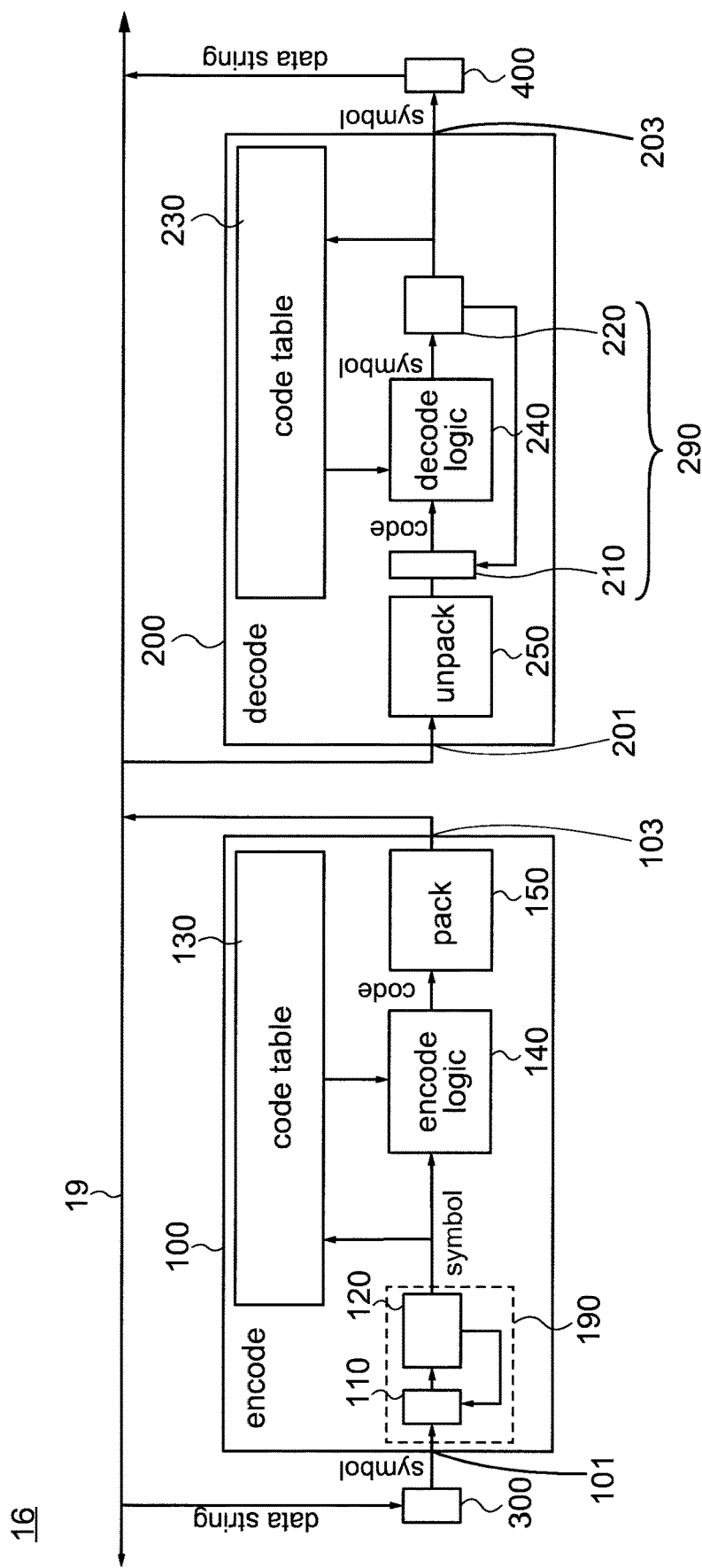
FIG. 2 is a block diagram showing a configuration of a compression/decompression circuit according to an embodiment.

FIG. 2 is a block diagram showing a configuration of a compression/decompression circuit according to an embodiment. As shown in FIG. 2, the compression/decompression circuit 16 includes an encoder 100, a decoder 200, a dictionary based compression section 300, and a dictionary based decompression section 400. An input terminal 101 of the encoder100 is connected to dictionary based compression section 300. An output terminal 103 of the encoder100 and an input terminal 201 of the decoder 200 are both connected to the inner bus 19. An output terminal 203 of the decoder 200 is connected to the dictionary based decompression section 400. An input terminal of dictionary based compression section 300 and an output terminal of dictionary based decompression section 400 are both connected to the inner bus 19. The encoder100 converts an input symbol into a codeword using an encoding table to be described later. The decoder 200 converts the codeword output from the encoder100 into an output symbol using a decoding code table, which will be described later.

In the compression/decompression circuit 16, for example, compression/decompression techniques using a dictionary based compression and a dictionary based decompression such as LZ77 compression is used. The dictionary based compression and dictionary based decompression are compression/decompression techniques which use similarities of data string. When input data string of compression target can be represented using a stored input data string previously input, input data string is compressed into an input symbol by the dictionary based compression section 300. The input symbol is information referring to stored input data string. The input symbols compressed by the dictionary based compression section 300 are input to the encoder 100. The input symbol input to the encoder 100 is further encoded in a codeword and transmitted to the internal bus 19. The codeword is input to the decoder 200 via the internal bus 19. The input codeword is decoded into the output symbol by the decoder 200. The decoded output symbols are output from the decoder 200. The output symbols output from the decoder 200 are decompressed to the output data string by the dictionary based decompression section 400.

In the following description, the configuration and functions of the encoder 100 and the decoder 200 of the compression/decompression circuit 16 described above. Common circuits can be used as the dictionary based compression section 300 and the dictionary based decompression section 400. Therefore, in the following description, the detailed description of the dictionary based compression section 300 and the dictionary based decompression section 400 is omitted.

The encoder 100 includes a symbol buffer 110, a number of symbol calculating section 120, a code table updating section 130, an encoding logic section 140, and a pack section 150. An input terminal 101 of the encoder100 is connected to an input terminal of the symbol buffer 110. An output terminal of the symbol buffer 110 is connected to an input terminal of the number of symbol calculating section 120. An output terminal of the number of symbol calculating section 120 is connected to an input terminal of each of the symbol buffer 110, the code table updating section 130, and the encoding logic section 140. The number of symbol calculating section 120 performs feedback control of the symbol buffer 110. An output terminal of the code table updating section 130 is connected to an input terminal of the encoding logic section 140. An output terminal of the encoding logic section 140 is connected to an input terminal of the pack section 150. An output terminal of the pack section 150 is connected to an output terminal103 of the encoder100. The code table updating section 130 may be referred to as a "first code table updating section".

The symbol buffer 110 temporarily stores the input symbol input to the encoder 100. A capacity of the symbol buffer 110 is set according to the number of symbols processed in one cycle. In the present embodiment, four symbols are processed in one cycle. Thus, symbol buffer 110 has a capacity to store at least four symbols. However, the number of symbols processed in one cycle may be smaller than 3 or larger than 5.

The number of symbol calculating section 120 calculates the "first data amount" based on the input symbol temporarily stored in the symbol buffer 110. The first data amount is a data amount in input data string prior to be compressed into the input symbol. The number of symbol calculating section 120 calculates the number of symbols corresponding to the calculated data amount. The number of symbols calculated in this manner is referred to as "the number of first consumption symbol". The number of symbol calculating section 120 selects symbols to be output to the code table updating section 130 and the encoding logic section 140 in the rear stage among the input symbols stored in the symbol buffer 110 based on the number of first consumption symbol. The number of symbol calculating section 120 controls the symbol buffer 110 based on the first number of consumption symbol. More specifically, the number of symbol calculating section 120 specifies the location where the input symbol to be processed in the next cycle, i.e., the address of the symbol buffer 110, based on the number of first consumption symbols.

The symbol buffer 110 and the number of symbol calculating section 120 may be referred to as an encoding flow control section 190. In other words, the encoding flow control section 190 controls the input to the code table updating unit 130 using the first data amount calculated based on the input symbols. The first data amount indicates a data amount of the input symbol. Detailed configurations of the symbol buffer 110 and the number of symbol calculating section 120 will be described later.

The code table updating section 130 has an encoding code table. As details will be described in later, the encoding code table is a table storing the entry number, the codeword, the input symbol, and the appearance frequency of the input symbol in association with each other (see FIGS. 10 and 11, which will be described later).

In the encoding code table, a relatively small entry number is assigned a relatively short codeword, and a relatively large entry number is assigned a relatively long codeword. In the encoding code table, the order of the input symbols is determined according to the appearance frequency of the input symbols, and the entry number and the codeword are assigned to the input symbols in the determined order. A relatively short codeword is assigned to the input symbol with a relatively high appearance frequency, and a relatively long codeword is assigned to the input symbol with a relatively low appearance frequency.

The code table updating section 130 updates the appearance frequency based on the input symbol input to the code table updating section 130 and rearranges the input symbols based on the appearance frequency. That is, the code table updating section 130 updates the encoding code table in accordance with an appearance pattern of the symbol.

The encoding logic section 140 converts the input symbol output from the number of symbol calculating section 120 of the encoding flow control section 190 into a codeword based on the encoding code table of the code table updating section 130. As details will be described in later, the encoding logic section 140 reads out a codeword associated with the input symbol from the code table updating section 130 by using the input symbol output from the encoding flow control section 190 as a key. The encoding logic section 140 converts the input symbol into a codeword read out from the code table updating section 130.

The pack section 150 collects one or more codewords output from the encoding logic section 140 into encoded data having a specified data size unit, and outputs the encoded data to the output terminal 103.

The decoder 200 includes a symbol buffer 210, a number of symbol calculating section 220, a code table updating section 230, a decoding logical section 240, and an unpack section 250. An input terminal 201 of the decoder 200 is connected to an input terminal of the unpack section 250. An output terminal of the unpack section 250 is connected to an input terminal of the symbol buffer 210. An output terminal of the symbol buffer 210 is connected to an input terminal of the decoding logic section 240. An output terminal of the decoding logic section 240 is connected to an input terminal of the number of symbol calculating section 220. An output terminal of the number of symbol calculating section 220 is connected to an input terminal of each of the symbol buffer 210 and the code table updating section 230 and an output terminal 203 of the decoder 200. The number of symbol calculating section 220 performs feedback control of the symbol buffer 210. An output terminal of the code table updating section 230 is connected to an input terminal of the decoding logic section 240. The code table updating section 230 may be referred to as a "second code table updating section".

The unpack section 250 extracts data in section of codewords from the codeword data input to the input terminal 201 of the decoder 200. The codeword data is data in section of a specific data size. The codeword extracted by the unpack section 250 corresponds to the codeword in which the input symbol is converted. That is, the output symbol obtained by converting the codeword of one section extracted by the unpack section 250 corresponds to the input symbol.

The symbol buffer 210 temporarily stores the codeword extracted by the unpack section 250. A capacity of the symbol buffer 210 is set according to the number of codewords processed in one cycle. In the present embodiment, four codewords are processed in one cycle. Thus, symbol buffer 210 has a capacity to store at least four codewords. However, the number of codewords processed in one cycle may be smaller than 3 or larger than 5.

The decoding logic section 240 converts the codeword output from the symbol buffer 210 into the output symbol based on the decoding code table. As details will be described in later, the decoding logic section 240 reads out the output symbol associated with the codeword from the code table updating section 230 by using the codeword output from the symbol buffer 210 as a key. The decoding logic section 240 converts the codeword into the output symbol read from the code table updating section 230.

The number of symbol calculating section 220 calculates the "second data amount" based on the output symbol converted from the codeword by the decoding logic section 240. The second data amount is a data amount in the output data string after the output symbol is decompressed. The number of symbol calculating section 220 calculates the number of symbols corresponding to the calculated data amount. The calculation method of the second data amount is the same as the calculation method of the first data amount. The number of symbols calculated in this manner is referred to as "the number of second consumption symbol". The number of symbol calculating section 220 selects output symbols to be output to the code table updating section 230 and the output terminal 203 among the output symbols output from the decoding logical unit 240 based on the number of second consumption symbols. The number of symbol calculating section 220 controls the symbol buffer 210 based on the number of second consumption symbols. Specifically, the number of symbol calculating section 220 specifies the location where the output symbol to be processed in the next cycle based on the number of second consumption symbols, i.e., the address of the symbol buffer 210.

The symbol buffers 210 and the number of symbol calculating section 220 may be referred to as a decoding flow control section 290. In other words, the decoding flow control section 290 controls the input to the code table updating section 230 using the second data amount calculated based on the output symbol. The second data amount indicates the data amount of the output symbol. Detailed configurations of the symbol buffer 210 and the number of symbol calculating section 220 will be described later.

The code table updating section 230 has a decoding code table. As details will be described in later, the decoding code table is a table for storing an appearance frequency of the codeword, the entry number, the output symbol, and the output symbol in association with each other (see FIGS. 10 and 11, which will be described later).

In the decoding code table, a relatively small entry number is assigned a relatively short codeword, and a relatively large entry number is assigned a relatively long codeword. In the decoding code table, the order of the output symbols is determined according to the appearance frequency of the output symbols, and the entry number and the codeword are assigned to the output symbols in the determined order. A relatively short codeword is assigned to the output symbol with a relatively high appearance frequency, and a relatively long codeword is assigned to the output symbol with a relatively low appearance frequency.

The code table updating section 230 updates the appearance frequency based on the output symbol corresponding to the codeword input to the code table updating section 230, and rearranges the output symbols based on the appearance frequency. That is, the code table updating section 230 updates the decoding code table in accordance with the codeword or the appearance pattern of the symbol corresponding to the codeword.

Although details will be described in later, the update content of the decoding code table performed by the code table updating section 230 is the same as the update content of the encoding code table performed by the code table updating section 130. Therefore, it is possible to correctly reproduce the state of the encoding code table in the decoding code table.

[Configuration of Encoding Flow Control Section 190]

Figure 3:
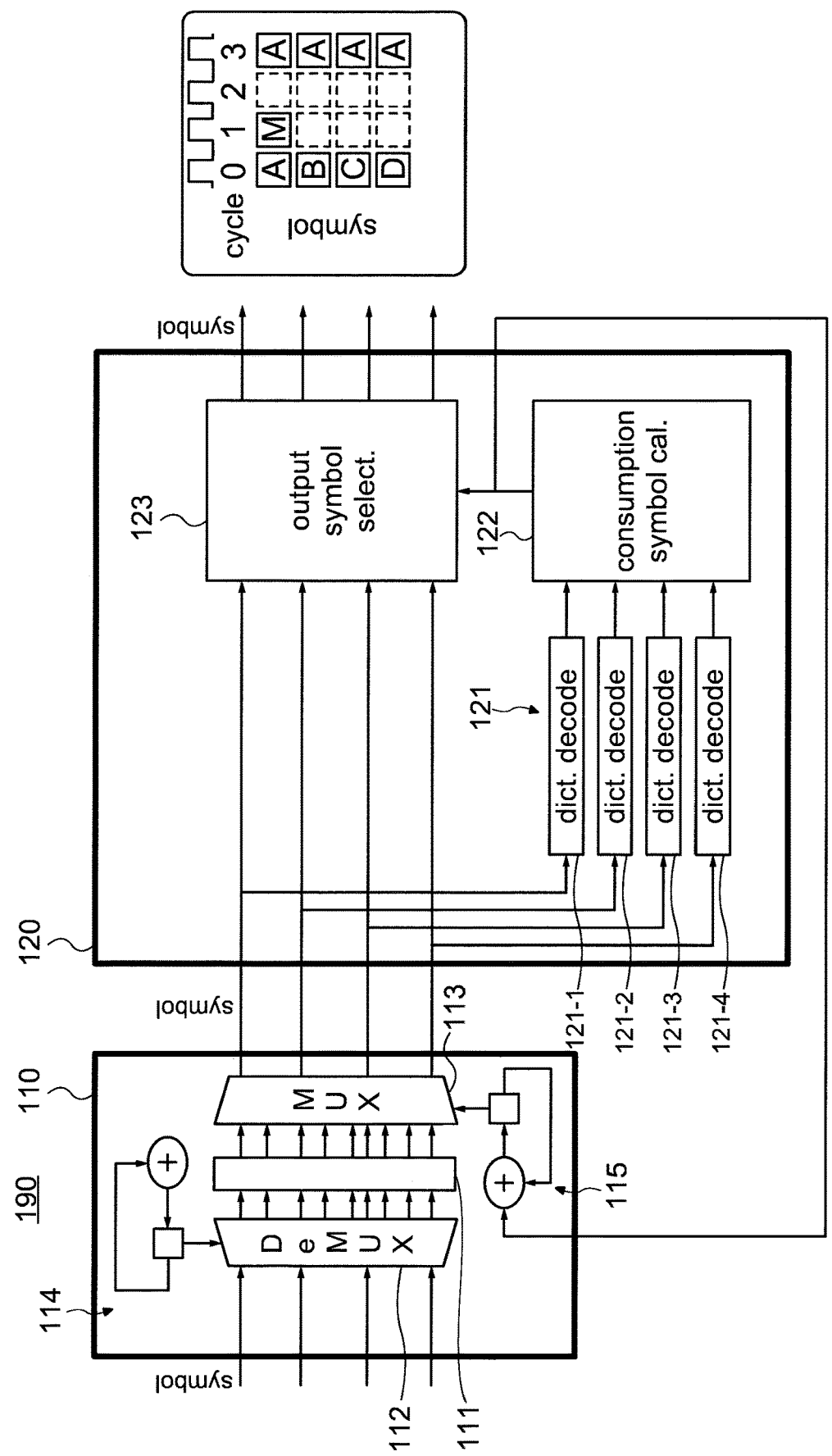
FIG. 3 is a block diagram showing a configuration of an encoding flow control section included in an encoder of a compression/decompression circuit according to an embodiment.

FIG. 3 is a block diagram showing a configuration of an encoding flow control section included in an encoder of a compression/decompression circuit according to an embodiment. As shown in FIG. 3, the encoding flow control section 190 includes the symbol buffer 110 and the number of symbol calculating section 120. The symbol buffer 110 includes a data storing section 111, a demultiplexer 112 (DeMUX), a multiplexer 113 (MUX), a write pointer 114, and a read pointer 115. The number of symbol calculating section 120 includes a dictionary based tentatively decoding section 121 (dict. decode), a number of consumption symbol calculating section 122 (consumption symbol cal.), and an output symbol selecting section 123 (output symbol select.). In the following description, the dictionary based tentatively decoding section 121 may be referred to as a "first tentatively decoding section", and the number of consumption symbol calculating section 122 may be referred to as "the number of first symbol calculating section".

The configuration of the symbol buffer 110 will be described. The demultiplexer 112 is connected to the input terminal of the symbol buffer 110. An output terminal of the demultiplexer 112 is connected to an input terminal of the data storing section 111. An output terminal of the data storing section 111 is connected to an input terminal of the multiplexer 113. An output terminal of the multiplexer 113 is connected to the output terminal of the symbol buffer 110. The write pointer 114 is connected to the demultiplexer 112. The read pointer 115 is connected to the multiplexer 113. The read pointer 115 is connected to the number of consumption symbol calculating section 122. As shown in FIG. 3, in the present embodiment, four input symbols are converted into codewords in one cycle. Thus, there are four signal lines each transmitting the symbols.

The configuration of the number of symbol calculating section 120 will be described. The dictionary based tentatively decoding section 121 is provided for each of the four signal lines. That is, the number of symbol calculating section 120 includes four separate dictionary based tentatively decoding sections 121. When it is not necessary to distinguish the four dictionary based tentatively decoding sections 121, it is simply referred to as the dictionary based tentatively decoding section 121. On the other hand, when the four dictionary based tentatively decoding sections 121 are distinguished from each other, they are expressed as dictionary based tentatively decoding sections 121-1, 121-2, 121-3, and 121-4, respectively.

The four dictionary based tentatively decoding sections 121 are connected to the multiplexer 113 of the symbol buffer 110. An output terminal of each dictionary based tentatively decoding section 121 is connected to an input terminal of the number of consumption symbol calculating section 122. An output terminal of the number of consumption symbol calculating section 122 is connected to an input terminal of the output symbol selecting section 123 and the read pointer 115. The four input symbols output from the symbol buffer 110 are input to the corresponding dictionary based tentatively decoding section 121. The same input symbol as the input symbol input to the dictionary based tentatively decoding section 121 is input to the output symbol selecting section 123.

Input symbol input to the symbol buffer 110 is transmitted to the data storing section 111 via the demultiplexer 112, and temporarily stored in the data storing section 111. In the data storing section 111, the location where the input symbol is stored (the address of the symbol buffer 110) is managed by the write pointer 114. The input symbols stored in the data storing section 111 are output to the number of symbol calculating section 120 via the multiplexer 113. The location where the multiplexer 113 reads the input symbols stored in the data storing section 111 is managed by the read pointer 115.

Each of signal lines in which the input symbol input to the number of symbol calculating section 120 is transmitted, is branched into two signal lines. One input symbol is input to the dictionary based tentatively decoding section 121, and another input symbol is input to the output symbol selecting section 123. The dictionary based tentatively decoding section 121 reproduces the first data amount when the input symbol is decompressed. In other words, the dictionary based tentatively decoding section 121 reproduces the data amount of input data string. The input data string is a data string before the input symbol input to the dictionary based tentatively decoding section 121 is compressed by dictionary based compression section 300.

The number of consumption symbol calculating section 122 calculates the number of symbols output from the output symbol selecting section 123 and the location at which the read pointer 115 reads out, based on the first data amount reproduced by the dictionary based tentatively decoding section 121. Specifically, the number of consumption symbol calculating section 122 calculates an average value of the output data amount in each cycle (from a cycle 0 to a current cycle) from the sum of these data amounts using "data amount to be output in the current cycle" and "data amount output in the past" output from the dictionary based tentatively decoding section 121. The "data amount output in the current cycle" is a data amount when each symbol is decompressed. The "data amount output in the past" is a data amount output from the number of symbol calculating section 120 from the cycle 0 to the cycle immediately before the current cycle, and is the data amount before the symbol is compressed. Furthermore, the number of consumption symbol calculating section 122 calculates the minimum number of first consumption symbol necessary for the calculated average value to be equal to or greater than a predetermined value, which is equal to or greater than 4 in the present embodiment. The calculation mentioned above is performed sequentially for each input symbol in each cycle. In the following explanation, start location of cycle 0 is data of the start location of input data string of compression target.

The number of consumption symbol calculating section 122 outputs the calculated number of first consumption symbol to the output symbol selecting section 123. Furthermore, the number of consumption symbol calculating section 122 outputs the number of first consumption symbols to the read pointer 115. As details will be described in later, the number of consumption symbol calculating section 122 specifies the location of the input symbol to be processed in the next cycle based on the data amount reproduced by the dictionary based tentatively decoding section 121 in the case where the input symbol is decompressed.

The output symbol selecting section 123 selects an input symbol to be output from the number of symbol calculating section 120 based on the number of first consumption symbol. For example, in the case where the number of first consumption symbol calculated with respect to input symbol is three, the output symbol selecting section 123 selects and outputs three input symbols from the start location among input symbols to be transmitted from the multiplexer 113 to the output symbol selecting section 123.

The number of first consumption symbol is transmitted to the read pointer 115. The read pointer 115 is incremented based on the number of first consumption symbol. That is, the read pointer 115 controls the location of the input symbol to be output in the next cycle among the locations in the multiplexer 113 based on the number of first consumption symbols.

The above operation will be explained using specific examples. In the embodiment shown in FIG. 3, four input symbols are input to the encoding flow control section 190 in one cycle. In FIG. 3, the input symbols "A", "B", "C", and "D" are literal symbols which are not compressed by the dictionary based compression section 300. The input symbol "M" is a match symbol which is compressed by the dictionary based compression section 300. The data amount in input data string before the input symbol "M" is compressed is 8 bytes. In the following description, in a case where the input symbol string "ABCDMAAAA" is input to the encoder 100.

As shown in FIG. 3, the input symbol string "ABCD" is input to the number of symbol calculating section 120 in cycle 0. As described above, since the input symbols "A", "B", "C", and "D" are literal symbols, the dictionary based tentatively decoding sections 121-1, 121-2, 121-3, and 121-4 output "1" to the number of consumption symbol calculating section 122 as data amounts when the input symbols "A", "B", "C", and "D" are decompressed, respectively.

The number of consumption symbol calculating section 122 calculates the number of first consumption symbol by using the data amount "4" (the sum of the data amount of the input symbols "A" to "D") output in the current cycle and the data amount "0" (the data amount is 0 because the cycle 0 is the first cycle) output in the past. In cycle 0, since the data amount of each symbol is "1", the minimum number of first consumption symbols required for the output data amount in cycle 0 to become 4 or greater than 4 is "4". Therefore, the number of consumption symbol calculating section 122 outputs "4" to the output symbol selecting section 123. As a result, the input symbol string "ABCD" is output from the output symbol selecting section 123.

The number of first consumption symbol "4" output from the number of consumption symbol calculating section 122 is also transmitted to the read pointer 115. The read pointer 115 adds (increments "4") the number of first consumption symbol "4" to the value of the current read pointer based on the received number of first consumption symbol "4". As a result, the location where the multiplexer 113 outputs to the number of symbol calculating section 120 in the next cycle is set to the input symbol string "MAAA" next to the input symbol string "ABCD".

Following the cycle 0 described above, the input symbol string "MAAA" is input to the number of symbol calculating section 120 in the cycle 1. As described above, since the input symbol "M" is a match symbol and "A" is a literal symbol, the dictionary based tentatively decoding sections 121-1 to 121-4 output "8", "1", "1", and "1" to the number of consumption symbol calculating section 122 as the data amount when the input symbols "M", "A", "A", and "A" are decompressed, respectively.

The number of consumption symbol calculating section 122 calculates the number of first consumption symbol using the data amounts "8", "1", "1", and "1" when each symbol in cycle 1 is decompressed, and the data amount "4" output in the past (cycle 0). Since the data amount of the input symbol "M" which is the start location is "8" in cycle 1, the sum of the data amount output in the current cycle and the data amount output in the past is "12". Therefore, the average value of the output data amount in each cycle (cycles 0 to 1) is "6". Therefore, in cycles 0 to 1, the minimum number of first consumption symbol required for the average value of the output data amount to be equal to 4 or greater than 4 is "1" (a value obtained by counting the input symbol "M" which is the start location of cycle 1 as the number of consumption symbol). Therefore, the number of consumption symbol calculating section 122 outputs "1" to the output symbol selecting section 123.

Upon receiving the number of first consumption symbols "1" from the number of consumption symbol calculating section 122, the output symbol selecting section 123 outputs one symbol from the start location of input data string. In the example of FIG. 3, based on the number of first consumption symbol "1", only the input symbol "M" is output, and empty symbols are output to the remaining output. Three vertical dotted boxes drawn under the input symbol "M" in cycle 1 indicate empty symbols.

As a result, in the cycle 1, the input symbol "M" and the empty symbol string "□□□" (□: empty input symbol) are output from the output symbol selecting section 123.

In cycle 1, the number of first consumption symbols "1" output from the number of consumption symbol calculating section 122 is also transmitted to the read pointer 115. Upon receiving the number of first consumption symbol "1", the read pointer 115 increments "1" based on the received number of first consumption symbol "1", and advances the location output by the multiplexer 113 by one. As a result, the location where the multiplexer 113 outputs to the number of symbol calculating section 120 in the next cycle is set to the input symbol string "AAAA" next to the input symbol "M".

Following the cycle 1, the input symbol string "AAAA" is input to the number of symbol calculating section 120 in the cycle 2. As described above, since the input symbol "A" is a literal symbol, the dictionary based tentatively decoding sections 121-1 to 121-4 output "1" to the number of consumption symbol calculating section 122 as the data amount when the input symbols "A" are decompressed, respectively.

The number of consumption symbol calculating section 122 calculates the number of first consumption symbol using the data amounts "1", "1", "1", and "1" when each symbol in cycle 2 is decompressed, and the data amounts "12" (4 bytes output in cycle 0 and 8 bytes output in cycle 1) output in the past (cycles 0 to 1). Since the data amount is already "12" in cycle 2, the average value of the output data amount in each cycle (cycles 0 to 2) is "4". Therefore, in cycles 0 to 2, the minimum number of first consumption symbol required for the average value of the output data amount to be equal to 4 or greater than 4 is "0". Therefore, the number of consumption symbol calculating section 122 outputs "0" to the output symbol selecting section 123.

As a result, empty symbols "□□□□" are output from the output symbol selecting section 123 in the cycle 2.

In cycle 2, the number of first consumption symbol "0" output from the number of consumption symbol calculating section 122 is also transmitted to the read pointer 115. The read pointer 115 is not incremented, and the location output by the multiplexer 113 is maintained at the location of cycle 1. As a result, the location where the multiplexer 113 outputs to the number of symbol calculating section 120 in the next cycle is remained the location of the input symbol string "AAAA".

Therefore, in cycles 1 to 2, while the input symbol string "M□□□□□□□" is output from the number of symbol calculating section 120, the input symbol string "AAAA" after the input symbol "M" is not output from the symbol buffer 110 to the number of symbol calculating section 120. In cycle 3, the input symbol string "AAAA" is output from the symbol buffer 110 to the number of symbol calculating section 120.

[Configuration of Decoding Flow Control Section 290]

Figure 4:
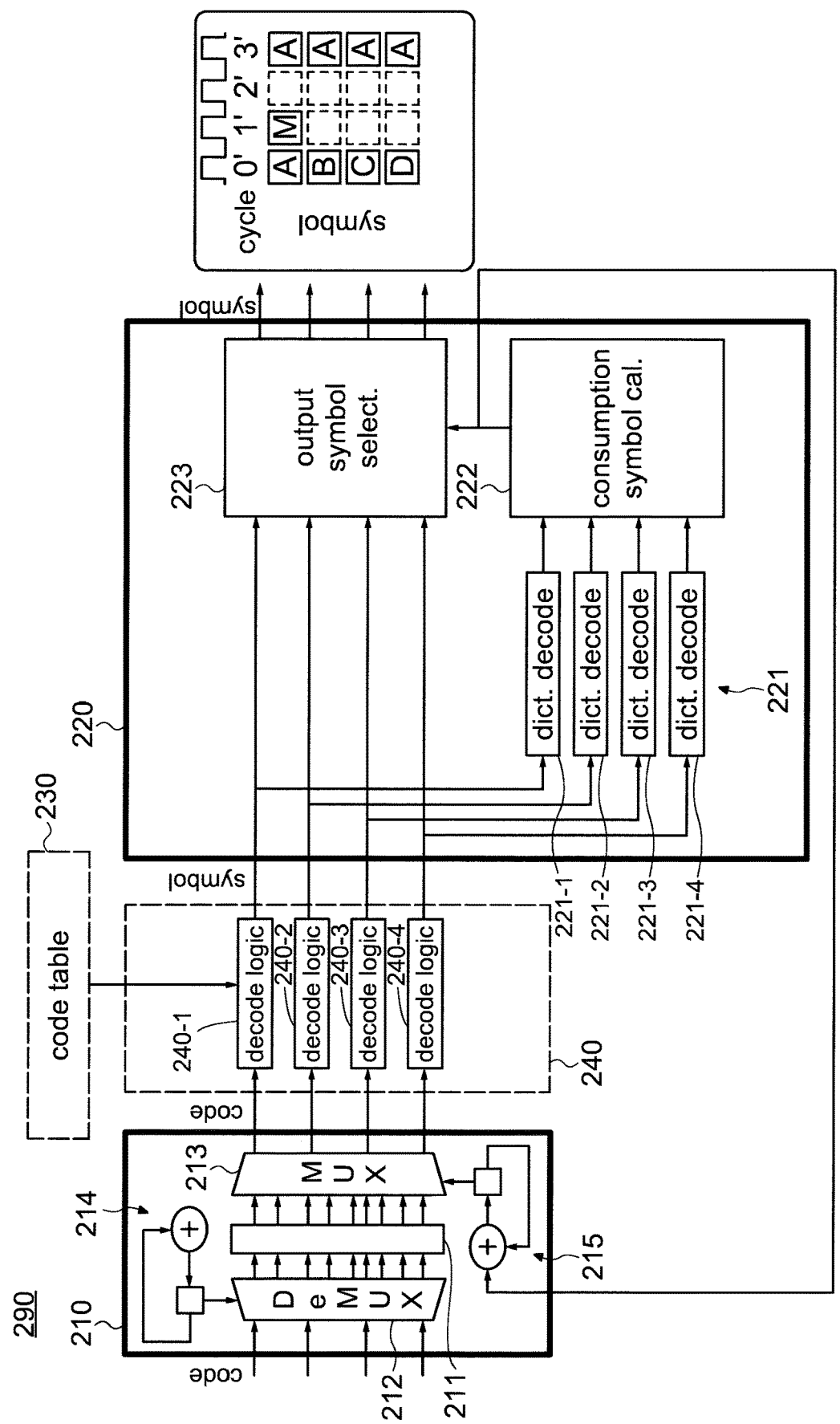
FIG. 4 is a block diagram showing a configuration of a decoding flow control section included in a decoder of a compression/decompression circuit according to an embodiment.

FIG. 4 is a block diagram showing a configuration of an encoding flow control section included in a decoder of a compression/decompression circuit according to the embodiment. As shown in FIG. 4, the decoding flow control section 290 includes the symbol buffer 210 and the number of symbol calculating section 220. The symbol buffer 210 includes a data storing section 211, a demultiplexer 212 (DeMUX), a multiplexer 213 (MUX), a write pointer 214, and a read pointer 215. The number of symbol calculating section 220 includes a dictionary based tentatively decoding section 221 (dict. decode), a number of consumption symbol calculating section 222 (consumption symbol cal.), and an output symbol selecting section 223 (output symbol select.). In the following description, the dictionary based tentatively decoding section 221 may be referred to as a "second tentatively decoding section", and the number of consumption calculating section 222 may be referred to as "the number of second symbol calculating section".

The configuration of the symbol buffer 210 will be described. The demultiplexer 212 is connected to the input terminal of the symbol buffer 210. An output terminal of the demultiplexer 212 is connected to an input terminal of the data storing section 211. An output terminal of the data storing section 211 is connected to an input terminal of the multiplexer 213. An output terminal of the multiplexer 213 is connected to the output terminal of the symbol buffer 210. The write pointer 214 is connected to the demultiplexer 212. The read pointer 215 is connected to the multiplexer 213. The read pointer 215 is connected to the number of consumption symbol calculating section 222. As shown in FIG. 4, in the present embodiment, four codewords are transmitted from the encoder 100 to the decoder 200 in one cycle, and the four codewords and the output symbols are processed in the decoder 200. Thus, four signal lines are provided for transmitting codewords or symbols.

A codeword is input to the symbol buffer 210. The symbol buffer 210 is controlled by the number of second consumption symbol output from the number of consumption symbol calculating section 222 described later, thus the codeword is output to the decoding logic section 240. The codeword is converted into an output symbol by the decoding logic section 240. The converted output symbols are input to the number of symbol calculating section 220.

The configuration of the number of symbol calculating section 220 will be described. The dictionary based tentatively decoding section 221 is provided for each of the four signal lines. That is, the number of symbol calculating section 220 includes four separate dictionary based tentatively decoding section 221. When it is not necessary to distinguish the four dictionary based tentatively decoding section 221, it is simply referred to as the dictionary based tentatively decoding sections 221. On the other hand, when the four dictionary based tentatively decoding sections 221 are distinguished from each other, they are expressed as dictionary based tentatively decoding sections 221-1, 221-2, 221-3, and 221-4, respectively.

The dictionary based tentatively decoding sections 221-1, 221-2, 221-3, and 221-4 are connected to decoding logic sections 240-1, 240-2, 240-3, and 240-4, respectively. An output terminal of each dictionary based tentatively decoding section 221 is connected to an input terminal of the number of consumption symbol calculating section 222. An output terminal of the number of consumption symbol calculating section 222 is connected to an input terminal of the output symbol selecting section 223 and the read pointer 215. The four output symbols output from the decoding logic sections 240 are input to the dictionary based tentatively decoding sections 221 corresponding to the decoding logic sections 240. As described above, the same symbol as the output symbol input to the dictionary based tentatively decoding section 221 is input to the output symbol selecting section 223. When it is not necessary to distinguish between the four decoding logic sections 240, it is simply referred to as the decoding logic section 240. On the other hand, when the four decoding logic sections 240 are represented separately, they are represented as decoding logic sections 240-1, 240-2, 240-3, and 240-4, respectively.

A codeword input to the symbol buffer 210 is transmitted to the data storing section 211 via the demultiplexer 212, and is temporarily stored in the data storing section 211. In the data storing section 211, the location where the codeword is stored (the address of the symbol buffer 210) is managed by the write pointer 214. The codeword stored in the data storing section 211 is output to the decoding logic section 240 via the multiplexer 213. The location in which the multiplexer 213 reads the codeword stored in the data storing section 211 is managed by the read pointer 215.

Each of signal lines in which the output symbol input to the number of symbol calculating section 220 is transferred, is branched into two signal lines. One output symbol is input to a dictionary based tentatively decoding section 221, and another output symbol is input to the output symbol selecting section 223. The dictionary based tentatively decoding section 221 (second tentatively decoding section) reproduces the data amount (that is, the second data amount when the output symbol is decompressed) of the output data string after being decompressed by the dictionary based decompression section 400 in the same manner as the dictionary based tentatively decoding section 121 (first tentatively decoding section) of FIG. 3.

The number of consumption symbol calculating section 222 calculates the number of symbols output from the output symbol selecting section 223 and the location at which the lead pointer 215 reads out, based on the second data amount reproduced by the dictionary based tentatively decoding section 221. Specifically, similarly to the number of consumption symbol calculating section 122, the number of consumption symbol calculating section 222 calculates an average value of the output data amount in each cycle (from a cycle 0 to a current cycle) from the sum of these data amounts using "data amount to be output in the current cycle" and "data amount output in the past" output from the dictionary based tentatively decoding section 221. Furthermore, the number of consumption symbol calculating section 222 calculates the minimum number of second consumption symbol necessary for the calculated average value to be equal to or greater than a predetermined value, which is equal to or greater than 4 in the present embodiment. The calculation mentioned above is performed sequentially for each output symbol in each cycle. In the following explanation, start location of cycle 0 is data of the start location of the output symbol (or the codeword corresponding to the output symbol) to be decompressed.

The number of consumption symbol calculating section 222 outputs the calculated number of second consumption symbol to the output symbol selecting section 223. Furthermore, the number of consumption symbol calculating section 222 outputs the number of second consumption symbol to the read pointer 215. As details will be described in later, the number of consumption symbol calculating section 222 specifies the location of the output symbol to be processed in the next cycle based on the data amount reproduced by the dictionary based tentatively decoding section 221 in the case where the output symbol is decompressed.

The output symbol selecting section 223 selects an output symbol to be output from the decoding logic section 240 based on the number of second consumption symbol. For example, in the case where the number of second consumption symbol calculated with respect to the output symbol is three, the output symbol selecting section 223 selects and outputs three output symbols from the start location among output symbols to be transmitted from the decoding logic section 240 to the output symbol selecting section 223.

The number of second consumption symbol is transmitted to the read pointer 215. The read pointer 215 is incremented based on the number of second consumption symbol. That is, the read pointer 215 controls the location of the output symbol to be output in the next cycle among the locations in the multiplexer 213 based on the number of second consumption symbols.

The operation mentioned above will be described with specific examples. As shown in FIG. 4, codewords converted from the input symbols string "ABCD" are input to the symbol buffer 210 in cycle 0'. The decoding code table of the code table updating section 230 reproduces the encoding code table of the code table updating section 130. Therefore, the decoding code table referred to when the codewords are converted to output symbols in the decoding logic section 240 is the same as the encoding code table referred to when the input symbols "ABCD" are converted to codewords in the encoding logic section 140. As a result, the decoding logic section 240 converts the codewords into the output-symbol string "ABCD" in the cycle 0'.

Since the output symbols "A", "B", "C", and "D" are literal symbols, the dictionary based tentatively decoding sections 221-1, 221-2, 221-3, and 221-4 output "1" to the number of consumption symbol calculating section 222 as data amounts when the output symbols "A", "B", "C", and "D" are decompressed, respectively.

The number of consumption symbol calculating section 222 calculates the number of second consumption symbol by using the data amount "4" (the sum of the data amounts of the output symbols "A" to "D") output in the current cycle and the data amount "0" (the data amount is 0 because the cycle 0' is the first cycle) output in the past. In the cycle 0', since the data amount of each symbol is "1", the minimum number of second consumption symbols required for the output data amount in the cycle 0' to become 4 or greater than 4 is "4". Therefore, the number of consumption symbol calculating section 222 outputs "4" to the output symbol selecting section 223. As a result, the output symbol string "ABCD" is output from the output symbol selecting section 223.

The number of second consumption symbol "4" output from the number of consumption symbol calculating section 222 is also transmitted to the read pointer 215. The read pointer 215 adds (increments "4") the number of second consumption symbol "4" to the value of the current read pointer based on the received number of second consumption symbol "4". As a result, the location of the multiplexer 213 to be output to the number of symbol calculating section 220 in the next cycle is set to the output symbol string "MAAA" next to the output symbol string "ABCD".

As shown in FIG. 2, the output symbol "ABCD" output from the number of symbol calculating section 220 is input to the code table updating section 230. The code table updating section 230 updates the appearance frequency based on the output symbol input to the code table updating section 230, and rearranges the output symbols based on the appearance frequency.

Following the cycle 0' above described, when the codeword converted from the input symbol string "MAAA" in cycle 1' is output from the symbol buffer 210, the codeword is converted into output symbols "M", "A", "A", and "A" in the decoding logic sections 240-1 to 240-4. Since the output symbol "M" is a match symbol and "A" is a literal symbol, the dictionary based tentatively decoding sections 221-1 to 221-4 outputs "8", "1", "1", and "1" to the number of consumption symbol calculating section 222 as the data amount when the output symbols "M", "A", "A", and "A" are decompressed, respectively.

The number of consumption symbol calculating section 222 calculates the number of second consumption symbol using the data amounts "8", "1", "1", and "1" when each symbol of the cycle 1' is decompressed, and the data amount "4" output in the past (cycle 0'). Since the data amount of the output symbol "M" which is the start location is "8" in cycle 1', the sum of the data amount output in the current cycle and the data amount output in the past is "12". Therefore, the average value of the output data amount in each cycle (cycles 0' to 1') is "6". Therefore, in cycles 0' to 1', the minimum number of second consumption symbol required for the average value of the output data amount to be equal to 4 or greater than 4 is "1" (a value obtained by counting the output symbols "M" which is the start location of cycle 1' as the number of consumption symbols). Therefore, the number of consumption symbol calculating section 222 outputs "1" to the output symbol selecting section 223.

Upon receiving the number of second consumption symbol "1" from the number of consumption symbol calculating section 222, the output symbol selecting section 223 outputs one symbol from the start location of the output symbol string. In the example of FIG. 4, based on the number of second consumption symbol "1", only the output symbol "M" is output, and empty symbols are output to the remaining output. Three vertical dotted boxes drawn under the output symbol "M" in cycle 1' and four vertical dotted boxes drawn in cycle 2' indicate empty symbols, respectively.

As the result, in cycle 1', the output symbol "M" and the empty symbol string "□□□" (□: empty input symbol) are output from the output symbol selecting section 223.

In cycle 1', the number of second consumption symbol "1" output from the number of consumption symbol calculating section 222 is also transmitted to the read pointer 215. Upon receiving the number of second consumption symbol "1", the read pointer 215 increments "1" based on the received number of second consumption symbol "1", and advances the location output by a multiplexer 213 by one. As a result, the location where the multiplexer 213 outputs to the number of symbol calculating section 220 in the next cycle is set to the output symbol string "AAAA" next to the input symbol "M".

Subsequent to the cycle 1', the output symbol string "AAAA" is input to the number of symbol calculating section 220 in cycle 2'. As described above, since the output symbol "A" is a literal symbol, the dictionary based tentatively decoding sections 221-1 to 221-4 output "1" to the number of consumption symbol calculating section 222 as the data amount when the output symbols "A" are decompressed, respectively.

The number of consumption symbol calculating section 222 calculates the number of second consumption symbol using the data amounts "1", "1", "1", and "1" when each symbol in the cycle 2' is decompressed, and the data amounts "12" (4 bytes output in the cycle 0' and 8 bytes output in the cycle 1') output in the past (cycles 0' to 1'). Since the data amount is already "12" in the cycle 2', the average value of the output data amount in each cycle (cycles 0' to 2') is "4". Therefore, in cycles 0' to 2', the minimum number of second consumption symbol required for the average value of the output data amount to be equal to 4 or greater than 4 is "0". Therefore, the number of consumption symbol calculating section 222 outputs "0" to the output symbol selecting section 223.

As a result, empty symbols "□□□□" are output from the output symbol selecting section 223 in the cycle 2'.

In cycle 2', the number of second consumption symbol "0" output from the number of consumption symbol calculating section 222 is also transmitted to the read pointer 215. The read pointer 215 is not incremented, and the location output by the multiplexer 213 is maintained at the location of cycle 1'. As a result, the location where the multiplexer 213 outputs to the number of symbol calculating section 220 in the next cycle is remained the location of the output symbol string "AAAA".

Therefore, in cycles 1' to 2', while the output symbol string "M□□□□□□" is output from the number of symbol calculating section 220, the output symbol string "AAAA" after the output symbol "M" is not output from the symbol buffer 210 to the number of symbol calculating section 220. In cycle 3', the output symbol string "AAAA" is output from the symbol buffer 210 to the number of symbol calculating section 220.

With the above configuration, the input symbol output from the encoding flow control section 190 in each cycle of cycles 0 to 3 can be matched with the output symbol output from the decoding flow control section 290 in each cycle of cycles 0' to 3'. In FIG. 3, the input symbol output from the encoding flow control section 190 is input to the code table updating section 130. In FIGS. 2 and 4, the output symbol output from the decoding flow control section 290 is input to the code table updating section 230. Therefore, the update content of the coding code table in the code table updating section 130 can be matched with the update content of the decoding code table in the code table updating section 230.

According to the present embodiment, when a plurality of symbols are processed in one cycle and the symbols are compressed, there is a case where an input symbol and an output symbol in each cycle do not match. For example, problems will be described below when the encoding flow control section 190 and the decoding flow control section 290 do not exist. In the configuration, in the encoder, the input symbol "ABCD" is output in cycle 0, the input symbol "M" is output in cycle 1, and the input symbol "AAAA" is output in cycle 2. However, information that the input data "M" is a match symbol is not transmitted to the decoder.

Therefore, in the decoder, the output symbol "ABCD" is output in cycle 0, the output symbol "MAAA" is output in cycle 1, and the output symbol "A" is output in cycle 2. When such an event occurs, the update content of the encoding code table of the encoder do not match with the update content of the decoding code table of the decoder. As a result, the decoding code table cannot correctly reproduce the state of the encoding code table.

However, according to the encoder 100 and the decoder 200 in the present embodiment, even in the case as described above, the decoding code table can correctly reproduce the state of the encoding code table. That is, the compression/decompression circuit 16 can process a plurality of symbols in one cycle while ensuring correct decoding of the encoded data. As a result, it is possible to improve the throughput of encoding and decoding in the compression/decompression circuit 16.

Second Embodiment

Hereinafter, a compression/decompression circuit 16A of the memory system according to the second embodiment will be described. The compression/decompression circuit 16A is similar to the compression/decompression circuit 16 according to the first embodiment. However, configurations of an encoding flow control section 190A and a decoding flow control section 290A included in the compression/decompression circuit 16A are different from the configurations of the encoding flow control section 190 and the decoding flow control section 290 included in the compression/decompression circuit 16. In the following descriptions of the encoding flow control section 190A and the decoding flow control section 290A, descriptions of the same configurations as those of the encoding flow control section 190 and the decoding flow control section 290 included in the compression/decompression circuits 16 are omitted, and differences from these will be mainly described.

[Configuration of the Compression/Decompression Circuit 16A]

Figure 5:
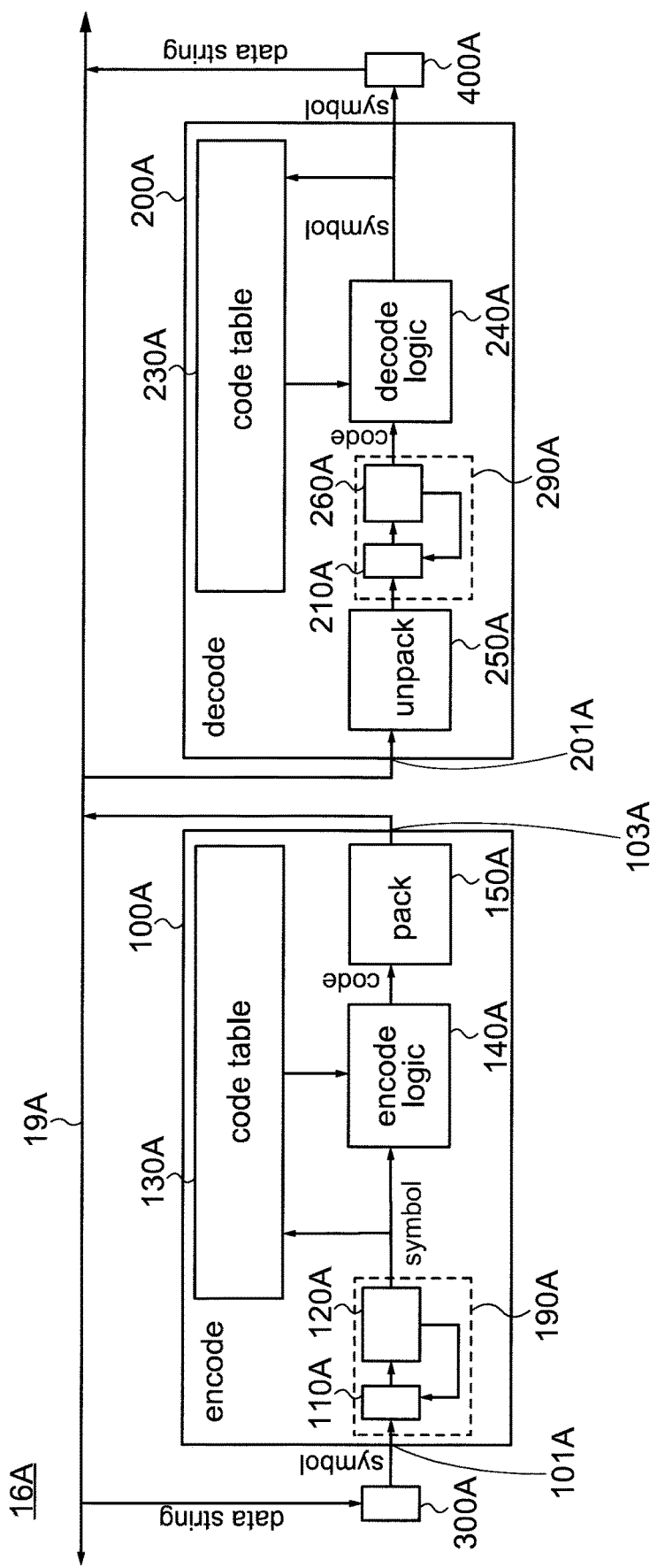
FIG. 5 is a block diagram showing a configuration of a compression/decompression circuit according to an embodiment.

FIG. 5 is a block diagram showing a configuration of a compression/decompression circuit according to an embodiment. Configuration of the compression/decompression circuit 16A showing in FIG. 5 is similar to the configuration of the compression/decompression circuit 16 showing in FIG. 2. However, the configuration of a decoder 200A showing in FIG. 5 is different from the configuration of the decoder 200 showing in FIG. 2.

As shown in FIG. 5, in the decoder 200A, a number of codeword calculating section 260A is provided instead of the number of symbol calculating section 220 of the decoder 200 in FIG. 2. The number of codeword calculating section 260A is provided between an unpack section 250A and a decoding logic section 240A. The number of symbol calculating section 220 showing in FIG. 2 is provided in the rear stage than the decoding logic section 240. Therefore, the output symbol which is converted by the decoding logic section 240 are input to the number of symbol calculating section 220. On the other hand, the number of codeword calculating section 260A showing in FIG. 5 is provided in the former stage of the decoding logic section 240A. Therefore, the codeword before being converted by the decoding logic section 240A is input to the number of codeword calculating section 260A.

The number of symbol calculating section 220 showing in FIG. 2 reproduces the second data amount when the output symbol is decompressed based on the output symbol, and calculates the number of second consumption symbol using the second data amount. However, the number of codeword calculating section 260A showing in FIG. 5 estimates the number of codewords corresponding to the number of second consumption symbol described above based on the codeword input to the number of codeword calculating section 260A. The number of codewords estimated in this manner is referred to as the "number of consumption codeword". The symbol buffer 210A and the number of codeword calculating section 260A may be referred to as a decoding flow control section 290A.

[Configuration of Encoding Flow Control Section 190A]

Figure 6:
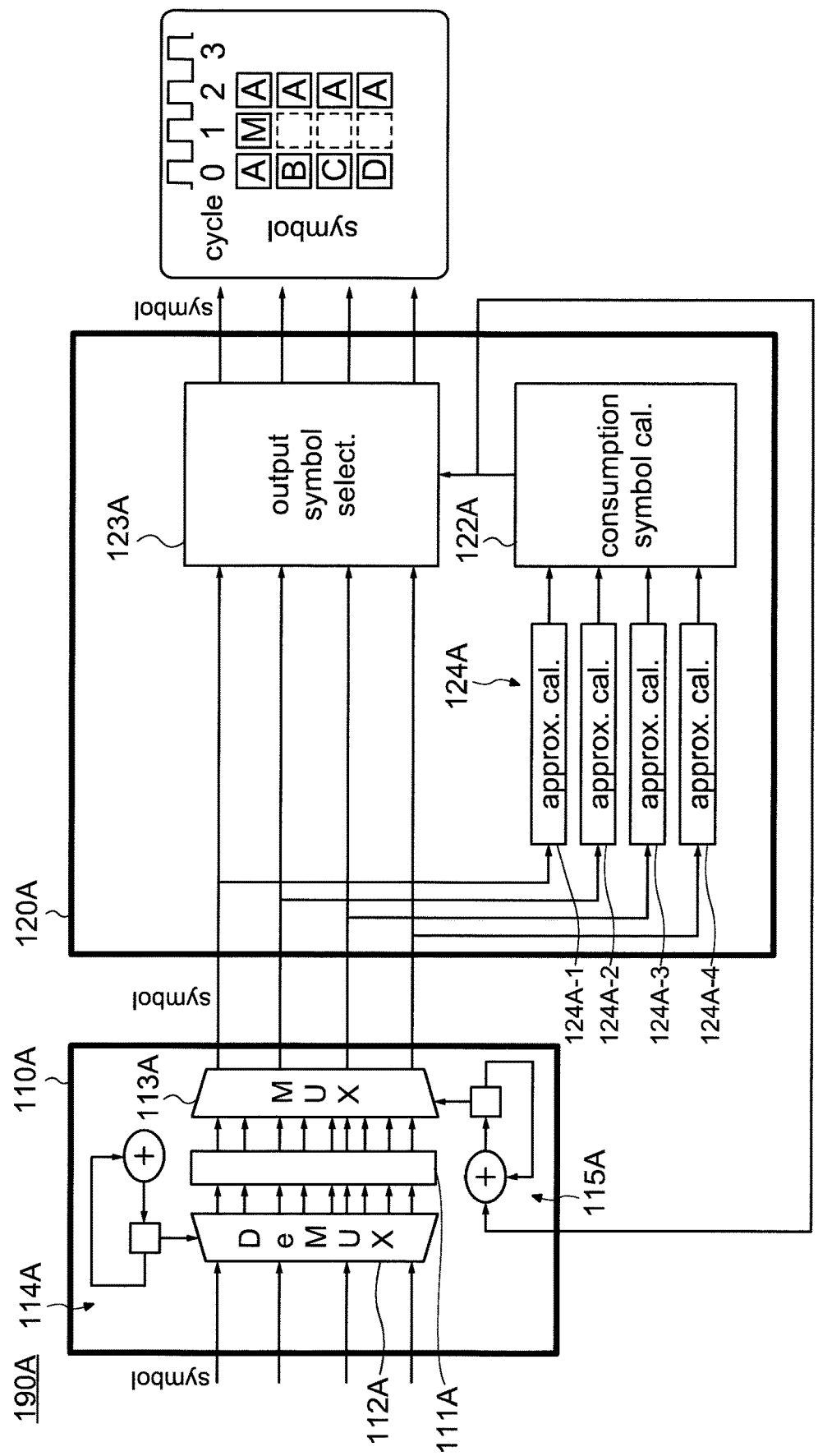
FIG. 6 is a block diagram showing a configuration of an encoding flow control section included in an encoder of a compression/decompression circuit according to an embodiment.

FIG. 6 is a block diagram showing a configuration of an encoding flow control section included in an encoder of a compression/decompression circuit according to an embodiment. The configuration of the encoding flow control section 190A shown in FIG. 6 is similar to the configuration of the encoding flow control section 190 showing in FIG. 3. However, the configuration of the number of symbol calculating section 120A included in the encoding flow control section 190A showing in FIG. 6 is different from the configuration of the number of symbol calculating section 120 included in the encoding flow control section 190 shown in FIG. 3. Since the configuration of a symbol buffer 110A showing in FIG. 6 is the same as the configuration of the symbol buffer 110 showing in FIG. 3, an explanation of the symbol buffer 110A is omitted.

As shown in FIG. 6, the number of symbol calculating section 120A includes an approximately calculating section 124A (approx. cal.), a number of consumption symbol calculating section 122A, and an output symbol selecting section 123A. According to compare FIG. 6 with FIG. 3, the number of symbol calculating section 120A of FIG. 6 has a configuration in which the dictionary based tentatively decoding section 121 of FIG. 3 is replaced with the approximately calculating section 124A. The other configurations are the same as the configuration of FIG. 3. In the following description, the approximately calculating section 124A may be referred to as a "first approximately calculating section", and the number of symbol calculating section number of consumption symbol calculating section 122A may be referred to as the "number of symbol calculating section". In the following description, the four approximately calculating sections 124A are simply referred to as approximately calculating sections 124A when it is not necessary to distinguish them from each other. On the other hand, when the four approximately calculating sections 124A are expressed by distinguishing them, they are expressed as the approximately calculating sections 124A-1, 124A-2, 124A-3, and 124A-4, respectively.

The approximately calculating section 124A estimates the first data amount when the input symbol is decompressed. That is, the approximately calculating section 124A estimates the data amount (first data amount) of input data string based on the type (first type) of the input symbol. The input data string is a data string before the input symbols input to the approximately calculating section 124A are compressed by a dictionary based compression section 300A. The first data amount in the present embodiment is not a data amount that accurately reproduces the data amount of input data string, but it is a data amount that reflects the data amount of input data string.

The format of the input symbol determines whether the input symbol is a literal symbol or a match symbol. For example, the input symbol has a flag that distinguishes whether the input symbol has information of "reference location" and "matching length" of the input symbol input in the past. Based on the flag, it is determined whether the input symbol is the literal symbol or the match symbol. That is, based on the type of the input symbol (first type), it is determined whether the input symbol is compressed. In other words, the first type includes information indicating whether or not the input symbol input to the encoder 100A is compressed.

The reference location indicates the location (address) where the symbol input previously is stored in the buffer (history buffer). The matching length is a value indicating a data amount in which the symbol (first symbol) input to the dictionary based compression section 300A matches the symbol (second symbol) stored in the history buffer. Indicator for determining whether the dictionary based compression section 300A executes a compression process is referred to as a minimum matching length. The dictionary based compression section 300A compares the first symbol string and the second symbol string, and evaluates the presence or absence of the second symbol string coinciding with the first symbol string. The first symbol string is a symbol string input to the dictionary based compression section 300A. The second symbol string is the symbol string previously input to the history buffer and stored in the history buffer. When a length of coincidence between the first symbol string and the second symbol string is equal to or greater than the minimum matching length, the dictionary based compression section 300A compresses the first symbol.

As a method of determining the type of input symbol, the symbol type can be determined based on the value of several bits from the start location of the input symbol. For example, when the input symbol is the literal symbol, the value of start location to 8 bits of the input symbol may be set to 0 to 255. When the input symbol is the match symbol, the value of start location to 8 bits of the input symbol may be set to 256 or more. In such cases, the "reference location" and "matching length" data are stored in the ninth and subsequent bits.

When the input symbol is the literal symbol which is not compressed, the approximately calculating section 124A estimates the data amount of the input symbol as one byte based on the type of the input symbol. When the input symbol is the match symbol which is compressed, the approximately calculating section 124A estimates the data amount of the input symbol as 4 bytes based on the type of the input symbol.

As described above, the approximately calculating section 124A (first approximately calculating section) sets the first data amount of the match symbol to a value (first value) larger than the first data amount of the literal symbol. The first data amount of the match symbol is a data amount of the input symbol when the input symbol is determined to be compressed. The first data amount of the literal symbol is a data amount of the input symbol when the input symbol is determined to be not compressed. For example, the first value is the four bytes described above. Then, the number of consumption symbol calculating section 122A controls the read pointer 115A based on the first value. This control identifies a location of the input symbol to be processed in the next cycle. In the present embodiment, the configuration in which the first data amount of the match symbol is larger than the first data amount of the literal symbol is exemplified, but the present invention is not limited to this configuration. The first value obtained by the approximately calculating section 124A (first approximately calculating section) may be the same as the second value obtained by the approximately calculating section 261A (second approximately calculating section) which is described later. That is, the first data amount of the match symbol may be smaller than the first data amount of the literal symbol. Alternatively, the first data amount of the match symbol and the first data amount of the literal symbol may have the same value. Alternatively, the first data amount of the match symbol may have the same value as minimum matching length. That is, in the present embodiment, minimum matching length is also 4 bytes which is the same as the first data amount of the match symbol.

As shown in FIG. 6, the input symbol string "ABCD" is input to the number of symbol calculating section 120A in the cycle 0. As described above, since the input symbols "A", "B", "C", and "D" are literal symbols, the approximately calculating sections 124A-1, 124A-2, 124A-3, and 124A-4 estimate the input symbols "A", "B", "C", and "D" as one byte, respectively. The approximately calculating section 124A outputs "1" to the number of consumption symbol calculating section 122A as the data amount when "A" to "D" are decompressed.

Similar to the number of consumption symbol calculating section 122 of the first embodiment, the number of consumption symbol calculating section 122A calculates "4" as the number of first consumption symbol, and outputs the number of first consumption symbols "4" to the output symbol selecting section 123A and the read pointers 115A. As a result, the input symbol string "ABCD" is output from the output symbol selecting section 123A, the read pointer 115A is incremented by "4", and the location of the multiplexer 113A is set to the input symbol string "MAAA" next to the input symbol string "ABCD".

Following the cycle 0 described above, the input symbol string "MAAA" is input to the number of symbol calculating section 120A in the cycle 1. As described above, since the input symbol "M" is a match symbol and "A" is a literal symbol, the approximately calculating sections 124A-1 to 124A-4 output "4", "1", "1", and "1" as data amounts when the input symbols "M", "A", "A" and "A" are decompressed, respectively, to the number of consumption symbol calculating section 122A.

The number of consumption symbol calculating section 122A calculates the number of first consumption symbol using the data amounts "4", "1", "1", and "1" when each symbol in the cycle 1 is decompressed, and the data amount "4" output in the past (cycle 0). Since the data amount of the input symbol "M" which is the start location is "4" in the cycle 1, the sum of the data amount output in the current cycle and the data amount output in the past is "8". The average value of the output data amount in each cycle (cycles 0 to 1) is "4". Therefore, in the cycles 0 to 1, the minimum number of first consumption symbol required for the average value of the output data amount to be equal to 4 or greater than 4 is "1" (a value obtained by counting the input symbol "M" which is the start location of cycle 1 as the number of consumption symbol). Therefore, the consumed number of symbol calculating section 122A outputs "1" to the output symbol selecting section 123A.

Upon receiving the number of first consumption symbols "1" from the number of consumption symbol calculating section 122A, the output symbol selecting section 123A outputs one symbol from the start location of input data string. In the example of FIG. 6, based on the number of first consumption symbol "1", only the input symbol "M" is output, and empty symbols are output to the remaining output. As a result, the input symbol string "M□□□" (□: empty input symbol) is output from the output symbol selecting section 123A.

In the cycle 1, the number of first consumption symbols "1" output from the number of consumption symbol calculating section 122A is also transmitted to the read pointer 115A. Upon receiving the number of first consumption symbol "1", the read pointer 115A increments by "1" based on the received number of first consumption symbols "1", and advances the location output by the multiplexer 113A by one. As a result, the location where the multiplexer 113A outputs to the number of symbol calculating section 120A in the next cycle is set to the input symbol string "AAAA" next to the input symbol "M".

Following the cycle 1 described above, the input symbol string "AAAA" is input to the number of symbol calculating section 120A in the cycle 2. As described above, since the input symbol "A" is a literal symbol, the approximately calculating sections 124A-1 to 124A-4 output "1" to the number of consumption symbol calculating section 122A as the data amount when the input symbols "A" are decompressed, respectively.

The number of consumption symbol calculating section 122A calculates the number of first consumption symbol by using the data amounts "1", "1", "1", and "1" when each symbol in the cycle 2 is decompressed, and the data amounts "8" (4 bytes output in the cycle 0 and 4 bytes output in the cycle 1) output in the past (cycles 0 to 1). Since the data amount of each symbol is "1" in the cycle 2, the minimum number of first consumption symbols required for the average value of the output data amount to be 4 or more in the cycles 0 to 2 is "4". Therefore, the number of consumption symbol calculating section 122A outputs "4" to the output symbol selecting section 123A. As a result, the input symbol string "AAAA" is output from the output symbol selecting section 123A.

Therefore, while the input symbol "M□□□" is output in the cycle 1, the input symbol "AAAA" after the input symbol "M" is not output from the symbol buffer 110A to the number of symbol calculating section 120A. In the cycle 2, the input symbol "AAAA" is output from the symbol buffer 110A to the number of symbol calculating section 120A.

[Configuration of Decoding Flow Control Section 290A]

Figure 7:
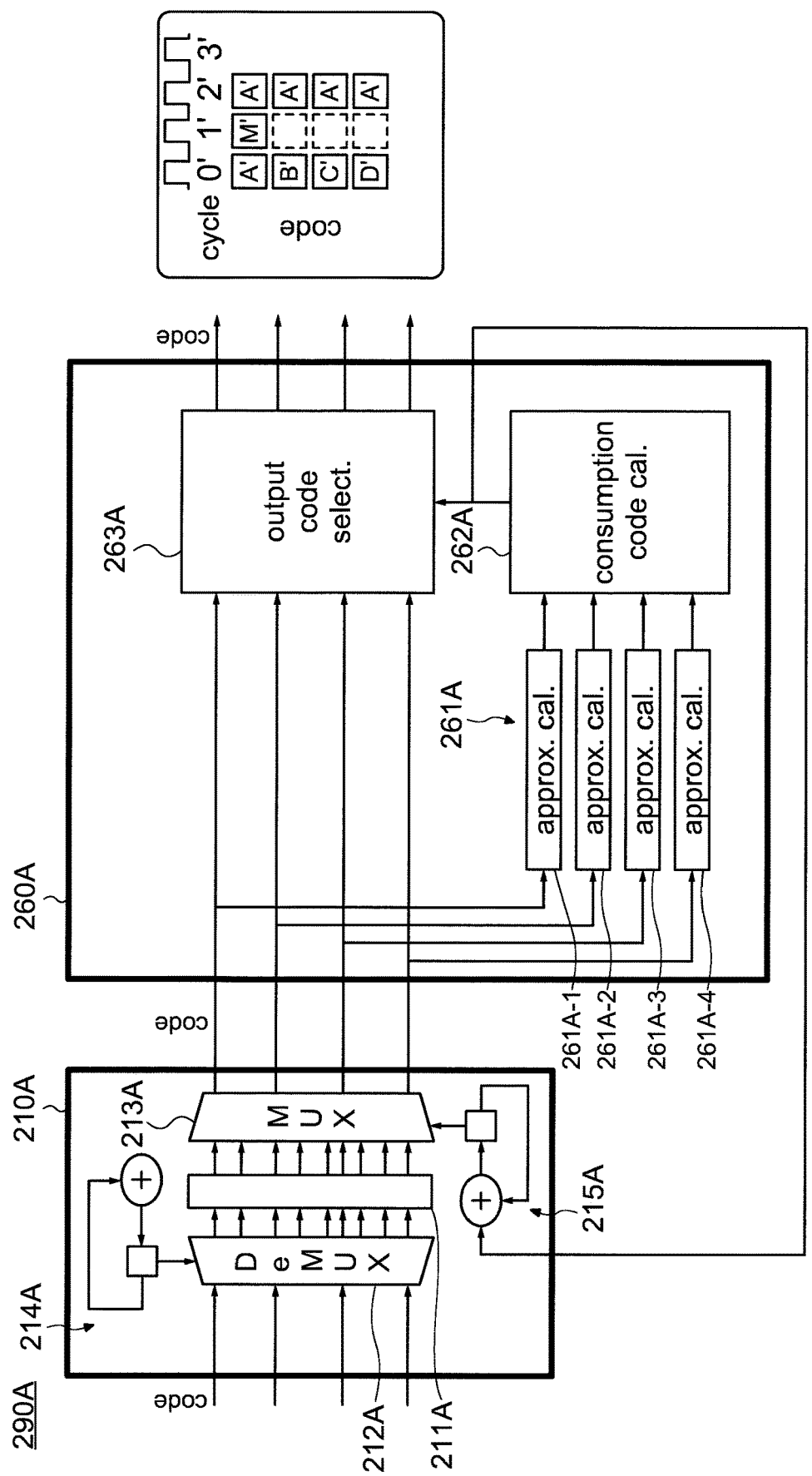
FIG. 7 is a block diagram showing a configuration of a decoding flow control section included in a decoder of a compression/decompression circuit according to an embodiment.

FIG. 7 is a block diagram showing a configuration of an encoding flow control section included in the decoder of a compression/decompression circuit according to an embodiment. The configuration of the decoding flow control section 290A shown in FIG. 7 is similar to the configuration of the decoding flow control section 290 shown in FIG. 4. However, the decoding flow control section 290A shown in FIG. 7 differs from the decoding flow control section 290 shown in FIG. 4 in that a number of codeword calculating section 260A is provided instead of the number of consumption symbol calculating section 220.

Further, in the decoding flow control section 290 shown in FIG. 4, the decoding logic section 240 is provided between the symbol buffer 210 and the number of symbol calculating section 220, and the output symbols are input to the number of symbol calculating section 220. On the other hand, in the decoding flow control section 290A shown in FIG. 7, the codewords output from the symbol buffer 210A are directly input to the number of codeword calculating section 260A. Since the configuration of the symbol buffer 210A shown in FIG. 7 is the same as the configuration of the symbol buffer 210 shown in FIG. 4, an explanation of the symbol buffer 210A is omitted.

As shown in FIG. 7, the number of codeword calculating section 260A includes an approximately calculating section 261A (approx. cal.), a number of consumption codeword calculating section 262A (consumption code cal.), and an output codeword selecting section 263A (output code select.). According to compare FIG. 7 with FIG. 4, the number of codeword calculating section 260A of FIG. 7 has a configuration in which the dictionary based tentatively decoding section 221, the number of consumption symbol calculating section 222, and the output symbol selecting section 223 of FIG. 4 are replaced with the approximately calculating section 261A, the number of consumption codeword calculating section 262A, and the output codeword selecting section 263A, respectively. The number of codeword calculating section 260A receives the codeword output from the symbol buffer 210A.

In the following description, the approximately calculating section 261A may be referred to as a "second approximately calculating section", and the number of consumption codeword calculating section 262A may be referred to as a "number of codeword calculating section". In the following description, the four approximately calculating sections 261A are simply referred to as the approximately calculating section 261A when it is not necessary to distinguish them from each other. On the other hand, when the four approximately calculating section 261A are expressed by distinguishing them, they are expressed as the approximately calculating sections 261A-1, 261A-2, 261A-3, and 261A-4, respectively.

The approximately calculating section 261A estimates the data amount (second data amount) of the output data string after the codeword input to the approximately calculating section 261A is converted into the output symbol and the converted output symbol is decompressed by a dictionary based decompression section 400A based on the codeword type (second type). The second data amount in the present embodiment is not a data amount that accurately reproduces the data amount of the output data string, but it is a data amount that reflects the data amount of the output data string.

The codeword format determines whether the codeword is a codeword converted from the literal symbol (hereinafter referred to as a "literal codeword") or a codeword converted from the match symbol (hereinafter referred to as a "match codeword"). For example, it is determined whether the codeword input to the approximately calculating section 124A is the literal codeword or the match codeword, depending on whether the codeword includes a specific pattern or not. That is, it is determined whether the output symbol in which the codeword has been converted is compressed based on the type of the codeword (the second type).

In other words, the second type includes information indicating whether the decoded output symbol of the codeword input to the decoder 200A is compressed.

The approximately calculating section 261A estimates the data amount of the codeword as 1 byte when the codeword is the literal codeword, and estimates the data amount of the codeword as 4 bytes when the codeword is the match codeword.

As described above, the approximately calculating section 261A (second approximately calculating section) sets the second data amount of the output symbol converted from the match codeword to a value (second value) larger than the second data amount of the output symbol converted from the literal codeword. The second data amount of the output symbol converted from the match codeword is a data amount of the output symbol when it is determined that the output symbol converted from the codeword is compressed. The second data amount of the output symbol converted from the literal codeword is a data amount of the output symbol when the output symbol is determined not to be compressed. For example, the second value is the four bytes described above. Then, the number of consumption codeword calculating section 262A controls the read pointer 215A based on the second value. This control identifies a location of the codeword to be processed in the next cycle. In the present embodiment, the configuration in which the second data amount of the match codeword is larger than the second data amount of the literal codeword is exemplified, but the present invention is not limited to this configuration. The second value obtained by the approximately calculating section 261A (second approximately calculating section) may be the same as the first value obtained by the approximately calculating section 124A (first approximately calculating section). That is, the second data amount of the match codeword may be smaller than the second data amount of the literal codeword. Alternatively, the second data amount of the match codeword and the second data amount of the literal codeword may be the same value.

As described above, in the present embodiment, the first value obtained by the approximately calculating section 124A (first approximately calculating section) based on a type (first type) of the input symbol is the same as the second value obtained by the approximately calculating section 261A (second approximately calculating section) based on a type (second type) of the codeword.

In FIG. 7, the codewords "A'", "B'", "C'", "D'", and "M'" are those in which the input symbols "A", "B", "C", "D", and "M" are encoded, respectively. As shown in FIG. 7, the codeword string "A'B'C'D'" is input to the number of codeword calculating section 260A in the cycle 0'. As described above, since the codewords "A'", "B'", "C'" and "D'" are literal codewords, the approximately calculating sections 261A-1, 261A-2, 261A-3 and 261A-4 estimate the respective codewords "A'", "B'", "C'" and "D'" as one byte. The approximately calculating section 261A outputs "1" to the number of consumption codeword calculating section 262A as the data amount when "A'" to "D'" are decompressed.

The number of consumption codeword calculating section 262A calculates "4" as the number of consumption codeword in the same manner as the number of consumption symbol calculating section 222 of the first embodiment, and outputs the number of consumption codeword "4" to the output codeword selecting section 263A and the read pointer 215A. As a result, the codeword string "A'B'C'D'" is output from the output codeword selecting section 263A, the read pointer 215A is incremented by "4", and the location of the multiplexer 213A is set to the codeword string "M'A'A'A'" next to the codeword string "A'B'C'D'".

Following the cycle 0' described above, the codeword string "M'A'A'A'" is input to the number of codeword calculating section 260A in the cycle 1'. As described above, since the codeword "M" is the match codeword and the codeword "A'" is the literal codeword, the approximately calculating sections 261A-1 to 261A-4 output "4", "1", "1", and "1" as data amounts when the codewords "M'", "A'", "A'" and "A'" are decompressed, respectively, to the number of consumption codeword calculating section 262A.

The number of consumption codeword calculating section 262A calculates the number of consumption codeword using the data amounts "4", "1", "1", and "1" when each symbol in the cycle 1' is decompressed, and the data amount "4" output in the past (cycle 0'). Since the data amount of the codeword "M" which is the start location is "4" in the cycle 1', the sum of the data amount output in the current cycle and the data amount output in the past is "8". The average value of the output data amount in each cycle (cycles 0' to 1') is "4". Therefore, in the cycles 0' to 1', the minimum number of consumption codeword required for the average value of the output data amount to be equal to 4 or greater than 4 is "1" (a value obtained by counting the codeword "M" which is the start location of cycle 1 as the number of consumed codeword). Therefore, the number of consumption codeword calculating section 262A outputs "1" to the output codeword selecting section 263A.

Upon receiving the number of consumption codeword "1" from the number of consumption codeword calculating section 262A, the output codeword selecting section 263A outputs one codeword from the start location of the codeword string. In the example of FIG. 7, based on the number of consumption codeword "1", only the codeword "M'" is output, and the empty codewords are output to the remaining output. As a result, the output codeword string "M'□□□" (□: empty codeword) is output from the output codeword selecting section 263A.

In the cycle 1', the number of consumption codeword "1" output from the number of consumption codeword calculating section 262A is also transmitted to the read pointer 215A. Upon receiving the number of consumption codeword "1", the read pointer 215A increments by "1" based on the received number of consumption codeword "1", and advances the location output by the multiplexer 213A by one. As a result, the location where the multiplexer 213A outputs to the number of codeword calculating section 260A in the next cycle is set to the codeword string "A'A'A'A'" next to the input symbol "M'".

Following the cycle 1', the codeword string "A'A'A'A'" is input to the number of codeword calculating section 260A in the cycle 2'. As described above, since the codeword "A'" is the literal codeword, the approximately calculating sections 261A-1 to A-4 output "1" to the number of consumption codeword calculating section 262A as the data amount when each codewords "A'" are decompressed, respectively.

The number of consumption codeword calculating section 262A calculates the number of consumption codeword by using the data amounts "1", "1", "1", and "1" when each codeword in the cycle 2' is decompressed, and the data amount "8" (4 bytes output in the cycle 0' and 4 bytes output in the cycle 1') output in the past (cycles 0' to 1'). Since the data amount of each codeword is "1" in the cycle 2', the minimum number of consumption codeword required for the average value of the output data amount to be 4 or more in the cycles 0' to 2' is "4". Therefore, the number of consumption codeword calculating section 262A outputs "4" to the output codeword selecting section 263A. As a result, the codeword string "A'A'A'A'" is output from the output codeword selecting section 263A.

Therefore, while the codeword "M'□□□" is output in the cycle 1', the codeword string "A'A'A'A'" after the output codeword "M'" is not output from the symbol buffer 210A to the number of codeword calculating section 260A. In the cycle 2', the codeword string "A'A'A'A'" is output from the symbol buffer 210A to the number of codeword calculating section 260A.

According to the configuration described above, the same effect as that of the first embodiment can be obtained. Further, since the decoding logic section 240A does not exist between the symbol buffer 210A and the number of codeword calculating section 260A, the decoder 200A of the present embodiment can shorten the feedback loop (loop generated by feedback from the number of consumption codeword calculating section 262A to the read pointer 215A) compared to the decoder 200 of the first embodiment.

Third Embodiment

Hereinafter, a compression/decompression circuit 16B according to the third embodiment will be described. The compression/decompression circuit 16B is similar to the compression/decompression circuit 16A according to the second embodiment. However, the configuration of a decoder 200B included in the compression/decompression circuit 16B is different from the configuration of the decoder 200A included in the compression/decompression circuit 16A. In the following description of the decoder 200B, description of the same configuration as that of the decoder 200A included in the compression/decompression circuit 16A is omitted, and mainly differences will be described.

[Configuration of the Compression/Decompression Circuit 16B]

Figure 8:
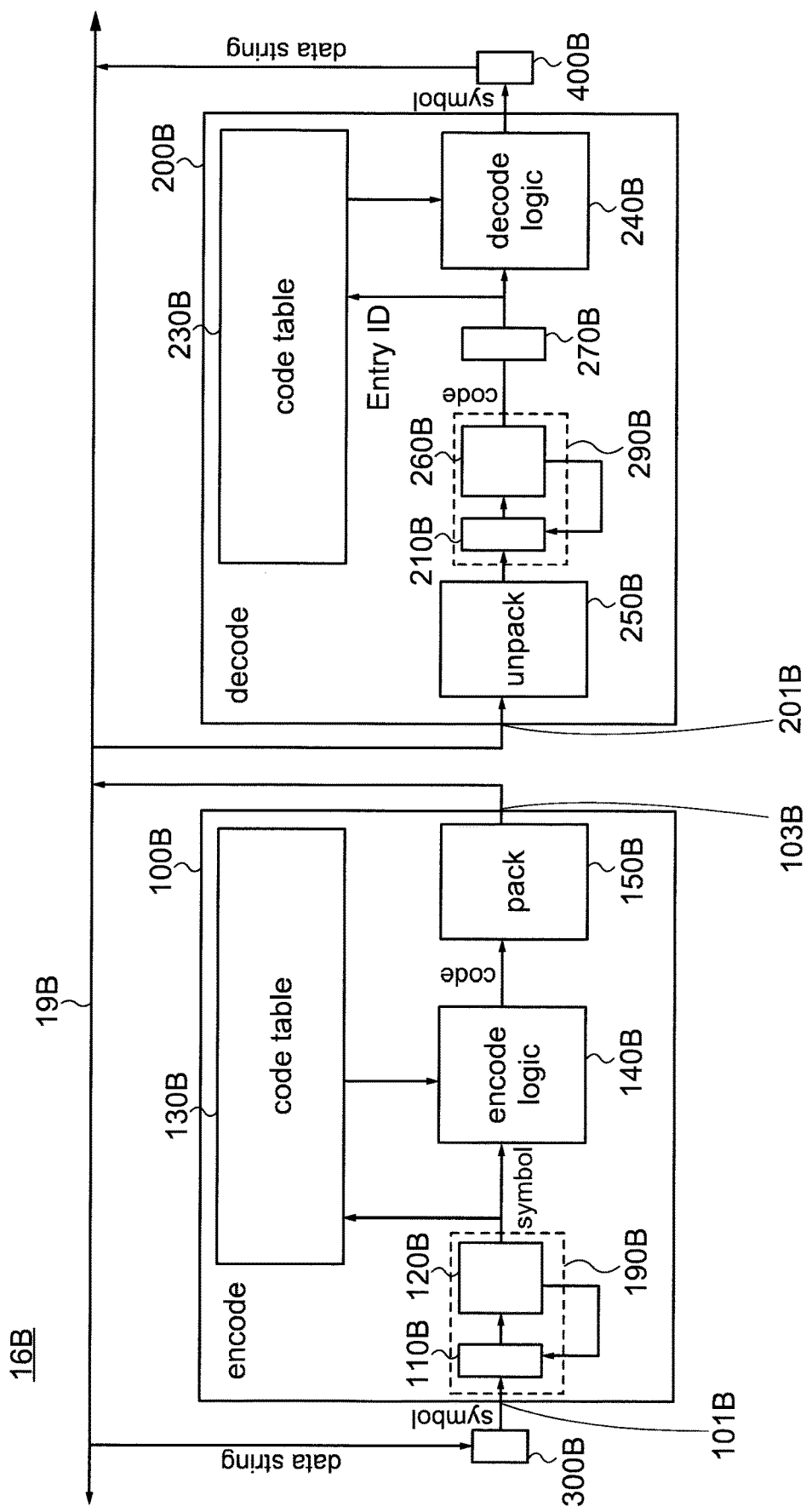
FIG. 8 is a block diagram showing a configuration of a compression/decompression circuit according to an embodiment.

FIG. 8 is a block diagram showing a configuration of a compression/decompression circuit according to an embodiment. The configuration of the compression/decompression circuit 16B shown in FIG. 8 is similar to the configuration of the compression/decompression circuit 16A shown in FIG. 5. However, the configuration of the decoder 200B shown in FIG. 8 is different from the configuration of the decoder 200A in FIG. 5.

As shown in FIG. 8, in the decoder 200B, an entry number extracting section 270B is provided between a number of codeword calculating section 260B and a decoding logic section 240B. The entry number extracting section 270B extracts the entry number from the codeword output from a decoding flow control section 290B. The entry number extracting section 270B inputs the extracted entry number (Entry ID) to a code table updating section 230B, and updates the decoding code table of the code table updating section 230B based on the entry number.

[Configuration of Code Table Updating Section 230B]

Figure 9:
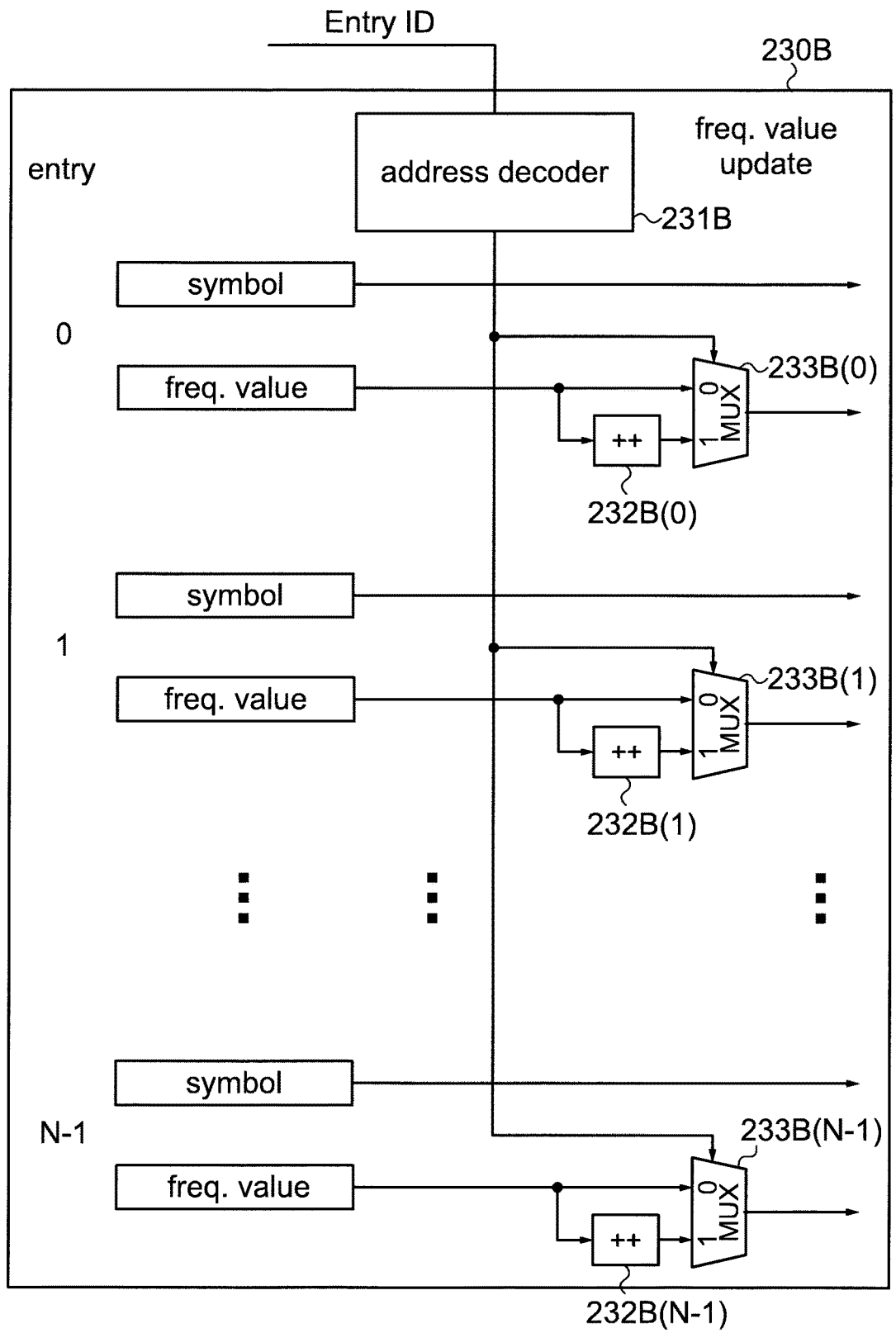
FIG. 9 is a block diagram showing a configuration of a code table updating section included in a decoder of a compression/decompression circuit according to an embodiment.

FIG. 9 is a block diagram showing a configuration of a code table updating section included in a decoder of a compression/decompression circuit according to an embodiment. As shown in FIG. 9, the code table updating section 230B includes an address decoder 231B (address decoder), N adders 232B corresponding to the number of entries (entry), and N multiplexers 233B.

The entry number (Entry ID) extracted by the entry number extracting section 270B is input to the address decoder 231B. An output symbol (symbol) and a frequency value (freq. value) are assigned to each of the N adders 232B and the N multiplexers 233B. The output of the address decoder 231B is input to the adder 232B and the multiplexer 233B. The address decoder 231B selects the multiplexer 233B based on the entry number input to the address decoder 231B. The frequency value input to the selected multiplexer 233B are incremented by "1" by the adder 232B and output from the multiplexer 233B. As described above, the decoding code table of the code table updating section 230B is updated based on the entry number extracted by the entry number extracting section 270B.

FIG. 10 is an example of a code table used for an entry number extraction performed in a decoder of a compression/decompression circuit according to an embodiment. As shown in FIG. 10, in the decoding code table, a codeword (Code), an entry number (Entry ID), an output symbol (Symbol), and a frequency value (Freq.) indicating the appearance of frequency of the codeword are associated. In the decoding code table, the codeword and the entry number are fixed. A relatively small entry number is assigned a relatively short codeword. A relatively large entry numbers are assigned a relatively long codeword.

In the example of FIG. 10, the output symbol "A" is assigned to the codeword "0" and the entry number "0". The frequency value of the output symbol "A" is "10". The output symbol "B" is assigned to the codeword "10" and the entry number "1". The frequency value of the output symbol "B" is "9". The output symbol "C" is assigned to the codeword "1100" and the entry number "2". The frequency value of the output symbol "C" is "8". As described above, the output symbols are arranged based on the frequency value.

[Code Table Updating Operation]

Figure 12:
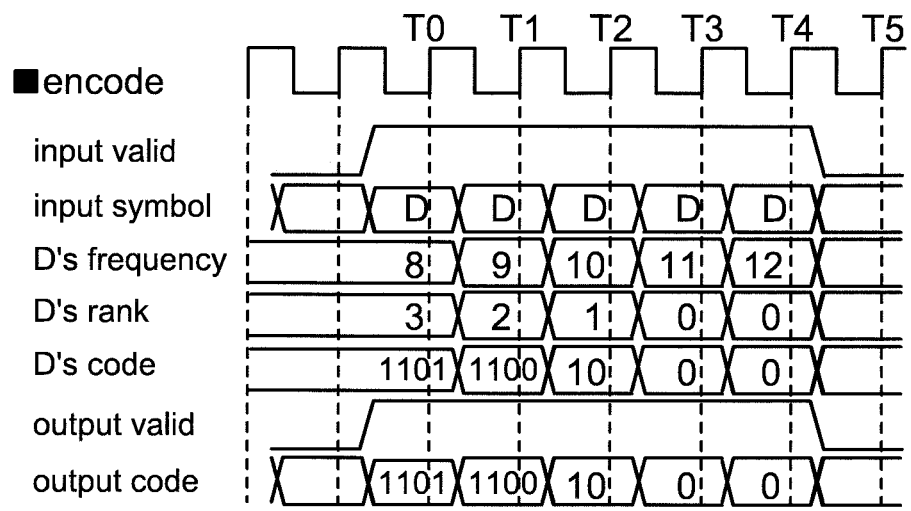
FIG. 12 is a timing chart showing operation of a code table updating section included in an encoder of a compression/decompression circuit according to an embodiment.
Figure 13:
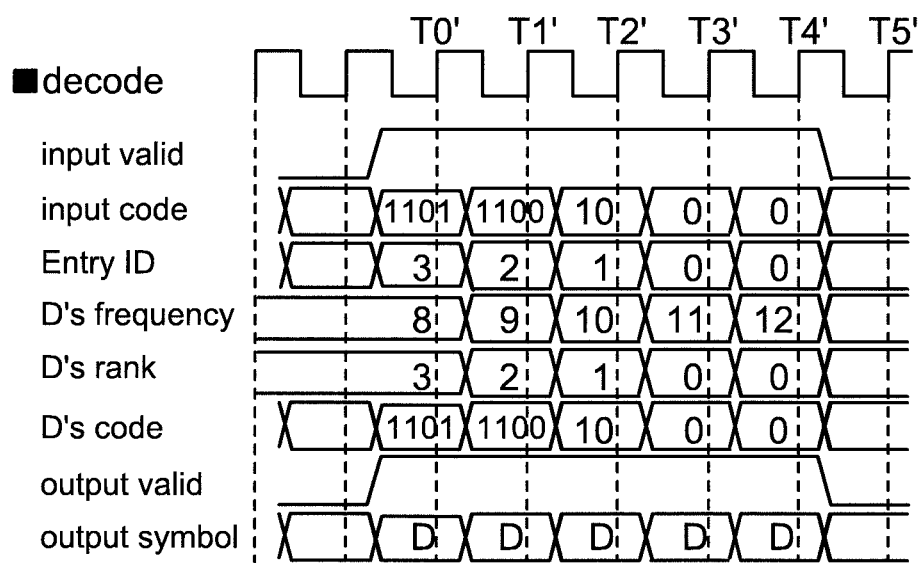
FIG. 13 is a timing chart showing operation of a code table updating section included in a decoder of a compression/decompression circuit according to an embodiment.

The operation of updating by a code table updating section 130B and the code table updating section 230B will be described with reference to FIGS. 11 to 13. FIG. 11 is a diagram showing an example of a state transition of a codebook included in an encoder or a decoder of a compression/decompression circuit according to an embodiment. FIG. 12 is a timing chart showing operation of a code table updating section included in an encoder of a compression/decompression circuit according to an embodiment. FIG. 13 is a timing chart showing operation of a code table updating section included in a decoder of a compression/decompression circuit according to an embodiment.

In FIGS. 11 to 13, the input symbol "D" is input to the encoder 1008 in each cycle of cycles T0 to T4. In each cycle, since the state of the coding code table included in the code table updating section 130B of the encoder 1008 is the same as the state of the decoding code table included in the code table updating section 230B of the decoder 200B, both states will be described with reference to FIG. 11.

In the present embodiment, a latency of each of the code table updating section 130B and the code table updating section 230B is "1". That is, although the coding code table of the code table updating section 1308 is updated by the input symbol input in a certain cycle, the timing at which the updated information is output from the code table updating section 130B is one cycle after the cycle at which the input symbol is input. Similarly, although the decoding code table of the code table updating section 230B is updated by the codeword input in a certain cycle, the timing at which the updated information is output from the code table updating section 230B is one cycle after the cycle at which the codeword is input.

In FIG. 11, five states of a code tables 500B are displayed. The code tables 510B to 550B are code tables in the cycles T0 to T4 or cycles T0' to T4', respectively.

A method of deriving a codeword to be output based on an input symbol input to the encoder 100B will be described with reference to FIG. 12. As shown in FIG. 12, the input (input valid) of the input symbol and the output (output valid) of the codeword are enabled prior to the cycle T0. In each of the cycles T0 to T4, the symbol "D" is input as the input symbol (input symbol).

In the timing chart of FIG. 12, a frequency value (D's frequency) of the symbol "D", a rank (D's rank) of the symbol "D", a codeword (D's code) of the symbol "D", and a codeword (output code) output from the encoder 100B in the respective cycles are shown.

When the symbol "D" is input to the encoder 100B in the cycle T0, the frequency value "8", the rank "3", and the codeword "1101" are derived based on the code table 510B in the cycle T0 in FIG. 11. Then, the frequency value of the symbol "D" is updated from "8" to "9", the table is sorted based on the frequency value. As a result, the code table 510B is updated to the code table 520B, and the code table 520B is applied in the next cycle T1. The state of code table 510B is before the update is performed by the input symbol input at cycle T0.

When the symbol "D" is input in the cycle T1, the frequency value "9", the rank "2", and the codeword "1100" are derived based on the code table 520B of the cycle T1. Then, the frequency value of the symbol "D" is updated from "9" to "10", the table is sorted based on the frequency value. As a result, the code table 520B is updated to the code table 530B, and the code table 530B is applied in the next cycle T2. The state of the code table 520B is after updating by the input symbol input in the cycle T0 is performed and before updating by the input symbol input in the cycle T1 is performed.

When the symbol "D" is input in the cycle T2, the frequency value "10", the rank "1", and the codeword "10" are derived based on the code table 530B of the cycle T2. Then, the frequency value of the symbol "D" is updated from "10" to "11", the table is sorted based on the frequency value. As a result, the code table 530B is updated to the code table 540B, and the code table 540B is applied in the next cycle T3. The state of the code table 530B is after updating by the input symbol input in the cycle T1 is performed and before updating by the input symbol input in the cycle T2 is performed.

When the symbol "D" is input in the cycle T3, the frequency value "11", the rank "0", and the codeword "0" are derived based on the code table 540B of the cycle T3. Then, the frequency value of the symbol "D" is updated from "11" to "12". As a result, the code table 540B is updated to the code table 550B, and the code table 550B is applied in the next cycle T4. The state of the code table 540B is after updating by the input symbol input in the cycle T2 is performed and before updating by the input symbol input in the cycle T3 is performed.

When the symbol "D" is input in the cycle T4, the frequency value "12", the rank "0", and the codeword "0" are derived based on the code table 550B of the cycle T4. The state of the code table 550B is after updating by the input symbol input in the cycle T3 is performed and before updating by the input symbol input in the cycle T4 is performed.

As a result, the codeword "1101" is output in the cycle T0, the codeword "1100" is output in the cycle T1, the codeword "10" is output in the cycle T2, and the codeword "0" is output in the cycles T3 and T4.

A method of deriving an output symbol to be output based on the codeword input to the decoder 200B will be described with reference to FIG. 13. As shown in FIG. 13, the input (input valid) of the codeword and the output (output valid) of the output symbol are enabled prior to cycle T0'. Then, in each of the cycles T0' to T4', the codeword (input code) output in the cycles T0 to T4 of FIG. 12 is input.

In the timing chart of FIG. 13, an entry number (Entry ID) of the codeword input in each cycle, a frequency value (D's frequency) of the symbol "D", a rank (D's rank) of the symbol "D", a codeword (D's code) of the symbol "D", and an output symbol (output symbol) output from the decoder 200B.

When the codeword "1101" is input to the decoder 200B in the cycle T0', the entry number "3", the frequency value "8", the rank "3", and the codeword "1101" are derived based on the code table 510B of the cycle T0' in FIG. 11. Therefore, in the cycle T0', the output symbol "D" corresponding to the input codeword "1101" is output. Then, the frequency value of the symbol "D" is updated from "8" to "9", the table is sorted based on the frequency value. As a result, the code table 510B is updated to the code table 520B, and the code table 520B is applied in the next cycle T1'.

When the codeword "1100" is input to the decoder 200B in the cycle T1', the entry number "2", the frequency value "9", the rank "2", and the codeword "1100" are derived based on the code table 520B of the cycle T1'. Therefore, in the cycle T1', the output symbol "D" corresponding to the input codeword "1100" is output. Then, the frequency value of the symbol "D" is updated from "9" to "10", the table is sorted based on the frequency value. As a result, the code table 520B is updated to the code table 530B, and the code table 530B is applied in the next cycle T2'.

When the codeword "10" is input to the decoder 200B in the cycle T2', the entry number "1", the frequency value "10", the rank "1", and the codeword "10" are derived based on the code table 530B of the cycle T2'. Therefore, in the cycle T2', the output symbol "D" corresponding to the input codeword "10" is output. Then, the frequency value of the symbol "D" is updated from "10" to "11", the table is sorted based on the frequency value. As a result, the code table 530B is updated to the code table 540B, and the code table 540B is applied in the next cycle T3'.

When the codeword "0" is input to the decoder 200B in the cycle T3', the entry number "0", the frequency value "11", the rank "0", and the codeword "0" are derived based on the code table 540B of the cycle T3'. Therefore, in the cycle T3', the output symbol "D" corresponding to the input codeword "0" is output. Then, the frequency value of the symbol "D" is updated from "11" to "12". As a result, the code table 540B is updated to the code table 550B, and the code table 550B is applied in the next cycle T4'.

When the codeword "0" is input to the decoder 200B in the cycle T4', the entry number "0", the frequency value "12", the rank "0", and the codeword "0" are derived based on the code table 550B of the cycle T4'. Therefore, in the cycle T4', the output symbol "D" corresponding to the input codeword "0" is output.

As described above, "DDDDD" is obtained as the output symbols of the cycles T0' to T4'. As described above, the state of code table 500B in each of cycles T0' to T4' accurately reproduces the state of code table 500B in each of cycles T0 to T4.

According to the configuration described above, the same effect as that of the second embodiment can be obtained. Further, the decoder 200B of the present embodiment can update the code table 500B of the code table updating section 230B using the entry number. Therefore, as shown in FIG. 9, the circuit scale can be made smaller than that of the decoder 200A of the second embodiment.

Fourth Embodiment

Hereinafter, a compression/decompression circuit 16C according to the fourth embodiment will be described. The compression/decompression circuit 16C is similar to the compression/decompression circuit 16B according to the third embodiment. However, it is different from the compression/decompression circuit 16B in that a delay buffer is added to an encoder 100C and a decoder 200C included in the compression/decompression circuit 16C. In the following description of the encoder 100C and the decoder 200C, descriptions of the same configurations as those of the encoder 100B and the decoder 200B included in the compression/decompression circuit 16B are omitted, and mainly differences will be described.

[Configuration of the Compression/Decompression Circuit 16C]

Figure 14:
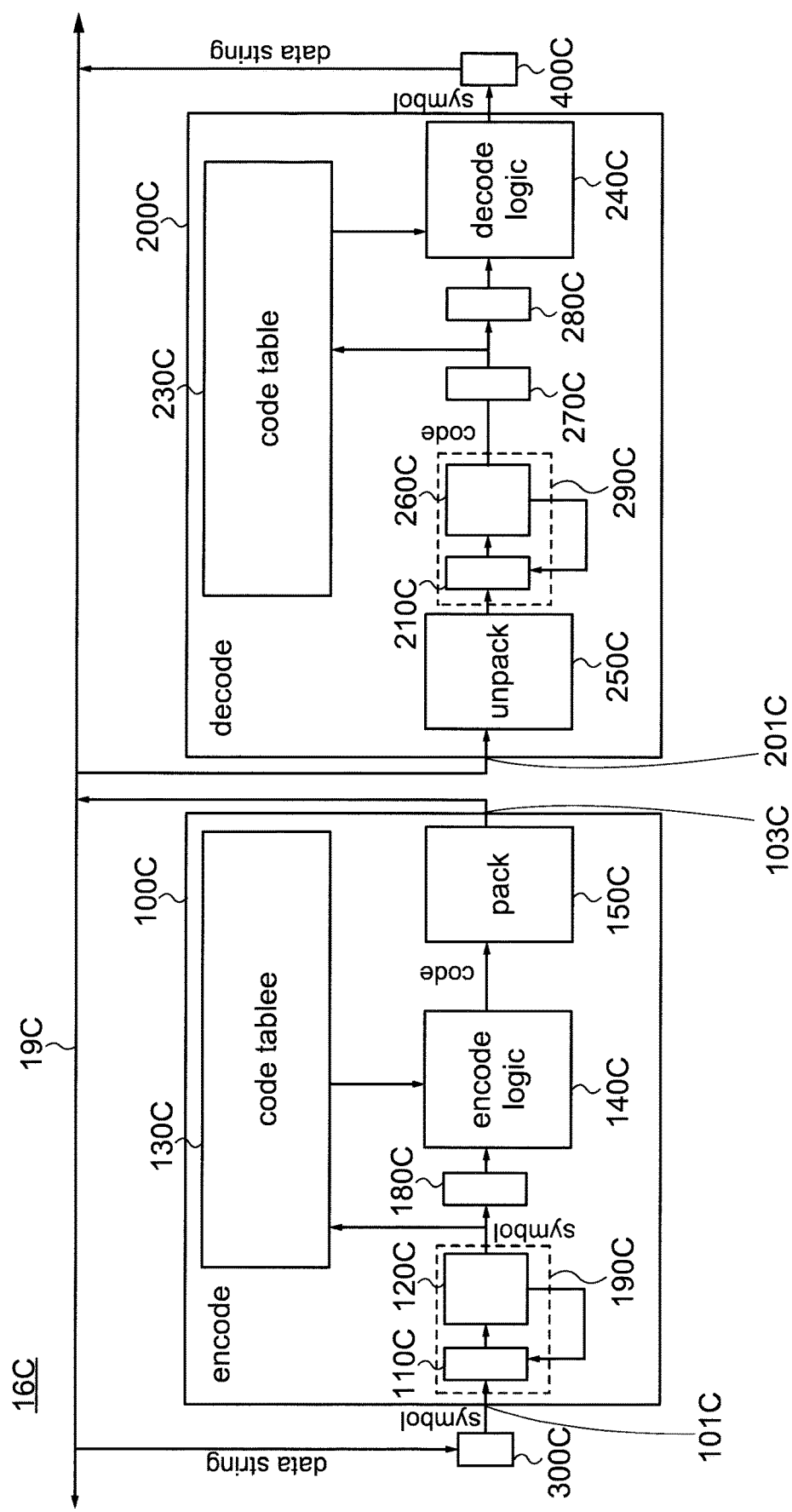
FIG. 14 is a block diagram showing a configuration of a compression/decompression circuit according to an embodiment.

FIG. 14 is a block diagram showing a configuration of a compression/decompression circuit according to an embodiment. The configuration of the compression/decompression circuit 16C shown in FIG. 14 is similar to the configuration of the compression/decompression circuit 16B shown in FIG. 8. However, the encoder 100C and the decoder 200C shown in FIG. 14 are different from the encoder 100B and the decoder 200B shown in FIG. 8 in that a first delay buffer 180C and a second delay buffer 280C are provided, respectively.

As shown in FIG. 14, in the encoder 100C, the first delay buffer 180C is provided between a number of symbol calculating section 120C and an encoding logic section 140C which are included in an encoding flow control section 190C. The first delay buffer 180C delays the input symbols. The number of cycles delayed by the first delay buffer 180C is smaller than the number of cycles delayed by the latency of the code table updating section 130C by one cycle.

As shown in FIG. 14, in the decoder 200C, a second delay buffer 280C is provided between a number of codeword calculating section 260C and a decoding logic section 240C which are included in a decoding flow control section 290C. Specifically, the second delay buffer 280C is provided between an entry number extracting section 270C and the decoding logic section 240C. The second delay buffer 280C delays the input codeword. The number of cycles delayed by the second delay buffer 280C is smaller than the number of cycles delayed by the latency of the code table updating section 230C by one cycle.

In the present embodiment, the case where the latency of each of the code table updating section 130C and the code table updating section 230C is "2" and the number of cycles delayed by the first delay buffer 180C and the second delay buffer 280C is "1" will be described. The number of cycles delayed by the first delay buffer 180C is the same as the number of cycles delayed by the second delay buffer 280C.

[Code Table Updating Operation]

Figure 15:
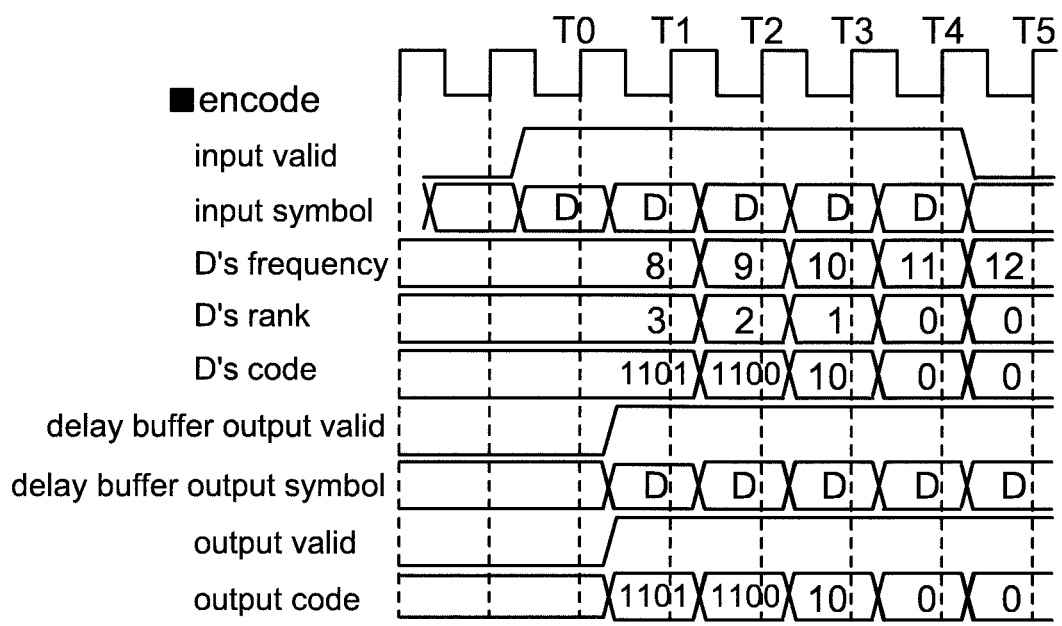
FIG. 15 is a timing chart showing operation of the code table updating section included in an encoder of a compression/decompression circuit according to an embodiment.
Figure 16:
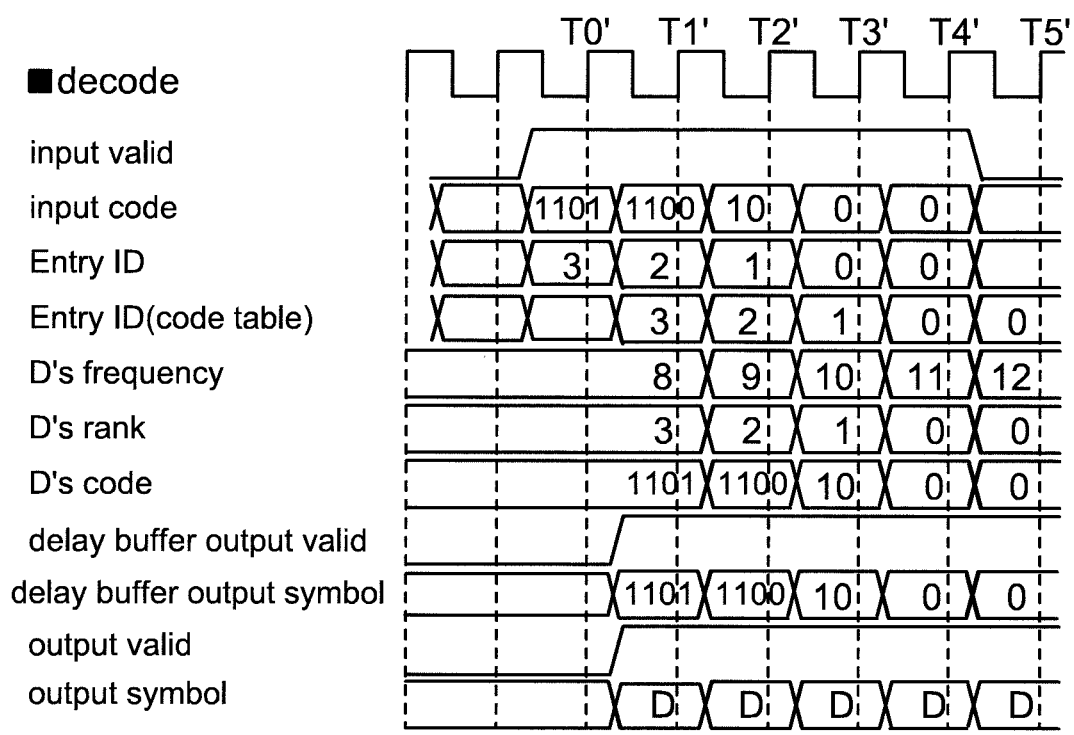
FIG. 16 is a timing chart showing operation of a code table updating section included in a decoder of a compression/decompression circuit according to an embodiment.

An operation in which the code table is updated by the code table updating section 130C and the code table updating section 230C will be described with reference to FIGS. 11, 15, and 16. FIG. 15 is a timing chart showing operation of a code table updating section included in an encoder of a compression/decompression circuit according to an embodiment. FIG. 16 is a timing chart showing operation of a code table updating section included in a decoder of a compression/decompression circuit according to an embodiment.

In the following description, the input symbol "D" is input to the encoder 100C in each cycle of cycles T0 to T4. In each cycle, since the state of the coding code table included in the code table updating section 130C of the encoder 100C is the same as the state of the decoding code table included in the code table updating section 230C of the decoder 200C, both states will be described with reference to FIG. 11.

As described above, the latency of each of the code table updating section 130C and the code table updating section 230C is "2". That is, although the coding code table of the code table updating section 130C is updated by the input symbol input in a certain cycle, the timing at which the updated information is output from the code table updating section 130C is two cycles after the cycle at which the input symbol is input. Similarly, although the decoding code table of the code table updating section 230C is updated by the codeword input in a certain cycle, the timing at which the updated information is output from the code table updating section 230C is one cycle after the cycle at which the codeword is input.

A method of deriving a codeword to be output based on an input symbol input to the encoder 100C will be described with reference to FIG. 15. As shown in FIG. 15, the input symbol (input valid) is enabled prior to cycle T0. In each of the cycles T0 to T4, the symbol "D" is input as the input symbol (input symbol). Subsequently, the output of the delay buffer (delay buffer output valid) and the output of the codeword (output valid) are enabled prior to cycle T1, the input symbol is converted, and the codeword is output.

In the timing chart of FIG. 15, a frequency value (D's frequency) of the symbol "D", a rank (D's rank) of the symbol "D", a codeword (D's code) of the symbol "D", an input symbol (delay buffer output symbol) output from the first delay buffer 180C, and a codeword (output code) output from the encoder 100C in the respective cycles are shown.

When the symbol "D" is input to the encoder 100C in the cycle T0, the input symbol is stored in the first delay buffer 180C and delayed by one cycle. Thus, no codeword is output in the cycle T0. The input symbol is also input to the code table updating section 130C, and the encoding code table is updated. That is, the frequency value of the symbol "D" is updated from "8" to "9", and the table is sorted based on the frequency value. As a result, the code table 510B of FIG. 11 is updated to the code table 520B. However, the code table 520B is applied in the cycle T2 after two cycles.

When the symbol "D" is input in the cycle T1, the input symbol is stored in the first delay buffer 180C, and the symbol "D" input in the cycle T0 is output from the first delay buffer 180C. When the symbol "D" output from the first delay buffer 180C is input to the encoding logic section 140C, the frequency value "8", the rank "3", and the codeword "1101" are derived based on the code table 510B (see FIG. 11) updated two cycles before.

Although the encoding code table is updated in the cycle T0 as described above, since the latency of the code table updating section 130C is "2", the code table used in the cycle T1 is the code table 510B which is not updated by the input symbol input in the cycle T0.

The input symbol is also input to the code table updating section 130C, and the encoding code table is updated. That is, the frequency value of the symbol "D" is updated from "9" to "10", and the table is sorted based on the frequency value. As a result, the code table 520B is updated to the code table 530B. However, the code table 530B is applied in the cycle T3 after two cycles.

When the symbol "D" is input in the cycle T2, the input symbol is stored in the first delay buffer 180C, and the symbol "D" input in the cycle T1 is output from the first delay buffer 180C. When the symbol "D" output from the first delay buffer 180C is input to the encoding logic section 140C, the frequency value "9", the rank "2", and the codeword "1100" are derived based on the code table 520B (see FIG. 11) updated in the cycle T0.

Although the encoding code table is updated in the cycle T1 as described above, since the latency of the code table updating section 130C is "2", the code table used in the cycle T2 is the code table 520B which is not updated by the input symbol input in the cycle T1.

The input symbol is also input to the code table updating section 130C, and the encoding code table is updated. That is, the frequency value of the symbol "D" is updated from "10" to "11", and the table is sorted based on the frequency value. As a result, the code table 530B is updated to the code table 540B. However, the code table 540B is applied in the cycle T4 after two cycles.

When the symbol "D" is input in the cycle T3, the input symbol is stored in the first delay buffer 180C, and the symbol "D" input in the cycle T2 is output from the first delay buffer 180C. When the symbol "D" output from the first delay buffer 180C is input to the encoding logic section 140C, the frequency value "10", the rank "1", and the codeword "10" are derived based on the code table 530B (see FIG. 11) updated in the cycle T1.

Although the encoding code table is updated in the cycle T2 as described above, since the latency of the code table updating section 130C is "2", the code table used in the cycle T3 is the code table 530B which is not updated by the input symbol input in the cycle T2.

The input symbol is also input to the code table updating section 130C, and the encoding code table is updated. That is, the frequency value of the symbol "D" is updated from "11" to "12". As a result, the code table 540B is updated to the code table 550B. However, the code table 550B is applied in the cycle T5 after two cycles.

When the symbol "D" is input in the cycle T4, the input symbol is stored in the first delay buffer 180C, and the symbol "D" input in the cycle T3 is output from the first delay buffer 180C. When the symbol "D" output from the first delay buffer 180C is input to the encoding logic section 140C, the frequency value "11", the rank "0", and the codeword "0" are derived based on the code table 540B (see FIG. 11) updated in the cycle T2. Although the encoding code table is updated in the cycle T3 as described above, since the latency of the code table updating section 130C is "2", the code table used in the cycle T4 is the code table 540B which is not updated by the input symbol input in the cycle T3. The input symbol is also input to the code table updating section 130C, and the encoding code table is updated.

Although the symbol is not input in the cycle T5, the symbol "D" input in the cycle T4 is output from the first delay buffer 180C. When the symbol "D" output from the first delay buffer 180C is input to the encoding logic section 140C, the frequency value "12", the rank "0", and the codeword "0" are derived based on the code table 550B (see FIG. 11) of the cycle T4. Although the encoding code table is updated in the cycle T4 as described above, since the latency of the code table updating section 130C is "2", the code table used in the cycle T5 is the code table 550B which is not updated by the input symbol input in the cycle T4.

As a result, the codeword "1101" is output in the cycle T1, the codeword "1100" is output in the cycle T2, the codeword "10" is output in the cycle T3, and the codeword "0" is output in the cycles T4 and T5.

A method of deriving an output symbol to be output based on the codeword input to the decoder 200C will be described with reference to FIG. 16. As shown in FIG. 16, the input (input valid) of the codeword is enabled prior to cycle T0'. Then, in each of the cycles T0' to T4', the codeword (input code) output in the cycles T0 to T4 of FIG. 15 is input. Subsequently, the output of the delay buffer (delay buffer output valid) and the output of the output symbol (output valid) are enabled prior to cycle T1', the codeword is converted, and the output symbol is output.

In the timing chart of FIG. 16, an entry number (Entry ID) of the codeword input in each cycle, an entry number (Entry ID (code table)) of the code table, a frequency value (D's frequency) of the symbol "D", a rank (D's rank) of the symbol "D", a codeword (D's code) of the symbol "D", and an output symbol (output symbol) output from the decoder 200C.

When the codeword "1101" is input to the decoder 200C in the cycle T0', the input symbol is stored in the second delay buffer 280C and delayed by one cycle. Therefore, no output symbol is output in the cycle T0'. The codeword is also input to the code table updating section 230C, and the decoding code table is updated in the same manner as in the cycle T0.

When the codeword "1100" is input to the decoder 200C in the cycle T1', the codeword is stored in the second delay buffer 280C, and the codeword "1101" input in the cycle T0' is output from the second delay buffer 280C. When the codeword "1101" output from the second delay buffer 280C is input to the decoding logic section 240C, the entry number "3", the frequency value "8", the rank "3", and the codeword "1101" of the code table are derived based on the code table 510B (see FIG. 11) updated two cycles before. Therefore, in the cycle T1', the output symbol "D" corresponding to the codeword "1101" input in the cycle T0' is output.

Although the decoding code table is updated in the cycle T0' as described above, since the latency of the code table updating section 230C is "2", the code table used in the cycle T1' is the code table 510B which is not updated by the codeword input in the cycle T0'. The codeword is also input to the code table updating section 230C, and the encoding code table is updated.

When the codeword "10" is input to the decoder 200C in the cycle T2', the codeword is stored in the second delay buffer 280C, and the codeword "1100" input in the cycle T1' is output from the second delay buffer 280C. When the codeword "1100" output from the second delay buffer 280C is input to the decoding logic section 240C, the entry number "2", the frequency value "9", the rank "2", and the codeword "1100" of the code table are derived based on the code table 520B (see FIG. 11) updated in the cycle T0'. Therefore, in the cycle T2', the output symbol "D" corresponding to the codeword "1100" input in the cycle T1' is output.

Although the decoding code table is updated in the cycle T1' as described above, since the latency of the code table updating section 230C is "2", the code table used in the cycle T2' is the code table 520B which is not updated by the codeword input in the cycle T1'. The codeword is also input to the code table updating section 230C, and the encoding code table is updated.

When the codeword "0" is input to the decoder 200C in the cycle T3', the codeword is stored in the second delay buffer 280C, and the codeword "10" input in the cycle T2' is output from the second delay buffer 280C. When the codeword "10" output from the second delay buffer 280C is input to the decoding logic section 240C, the entry number "1", the frequency value "10", the rank "1", and the codeword "10" of the code table are derived based on the code table 530B (see FIG. 11) updated in the cycle T1'. Therefore, in the cycle T3', the output symbol "D" corresponding to the codeword "10" input in the cycle T2' is output.

Although the decoding code table is updated in the cycle T2' as described above, since the latency of the code table updating section 230C is "2", the code table used in the cycle T3' is the code table 530B which is not updated by the codeword input in the cycle T2'. The codeword is also input to the code table updating section 230C, and the encoding code table is updated.

When the codeword "0" is input to the decoder 200C in the cycle T4', the codeword is stored in the second delay buffer 280C, and the codeword "0" input in the cycle T3' is output from the second delay buffer 280C. When the codeword "0" output from the second delay buffer 280C is input to the decoding logic section 240C, the entry number "0", the frequency value "11", the rank "0", and the codeword "0" of the code table are derived based on the code table 540B (see FIG. 11) updated in the cycle T2'. Therefore, in the cycle T4', the output symbol "D" corresponding to the codeword "0" input in the cycle T3' is output.

Although the decoding code table is updated in the cycle T3' as described above, since the latency of the code table updating section 230C is "2", the code table used in the cycle T4' is the code table 540B which is not updated by the codeword input in the cycle T3'. The codeword is also input to the code table updating section 230C, and the encoding code table is updated.

Although the codeword is not input in the cycle T5', the codeword "0" input in the cycle T4' is output from the second delay buffer 280C. When the codeword "0" output from the second delay buffer 280C is input to the decoding logic section 240C, the entry number "0", the frequency value "12", the rank "0", and the codeword "0" of the code table are derived based on the code table 550B (see FIG. 11) updated in the cycle T3'. Therefore, in the cycle T5', the output symbol "D" corresponding to the codeword "0" input in the cycle T4' is output.

Although the decoding code table is updated in the cycle T4' as described above, since the latency of the code table updating section 230C is "2", the code table used in the cycle T5' is the code table 550B which is not updated by the codeword input in the cycle T4'. The codeword is also input to the code table updating section 230C, and the encoding code table is updated.

As described above, "DDDDD" is obtained as the output symbols of the cycles T0' to T4'. As described above, the state of code table 500C in each of cycles T0' to T4' accurately reproduces the state of code table 500C in each of cycles T0 to T4.

According to the configuration described above, the same effect as that of the third embodiment can be obtained. Furthermore, the first delay buffer 180C and the second delay buffer 280C respectively provided in the encoder 100C and the decoder 200C of the present embodiment can use a relatively new code table.

Fifth Embodiment

Hereinafter, a memory system 1D according to the fifth embodiment will be described. The memory system 1D is similar to the memory system 1 according to the first embodiment. However, an encoder 100D and a decoder 200D of the memory system 1D are different from the encoder 100 and the decoder 200 of the memory system 1 in that an empty cycle detecting section are added. In the following description of the encoder 100D and the decoder 200D, descriptions of the same configurations as those of the encoder 100 and the decoder 200 of the memory system 1 are omitted, and mainly differences will be described.

[Configuration of the Compression/Decompression Circuit 16D]

Figure 17:
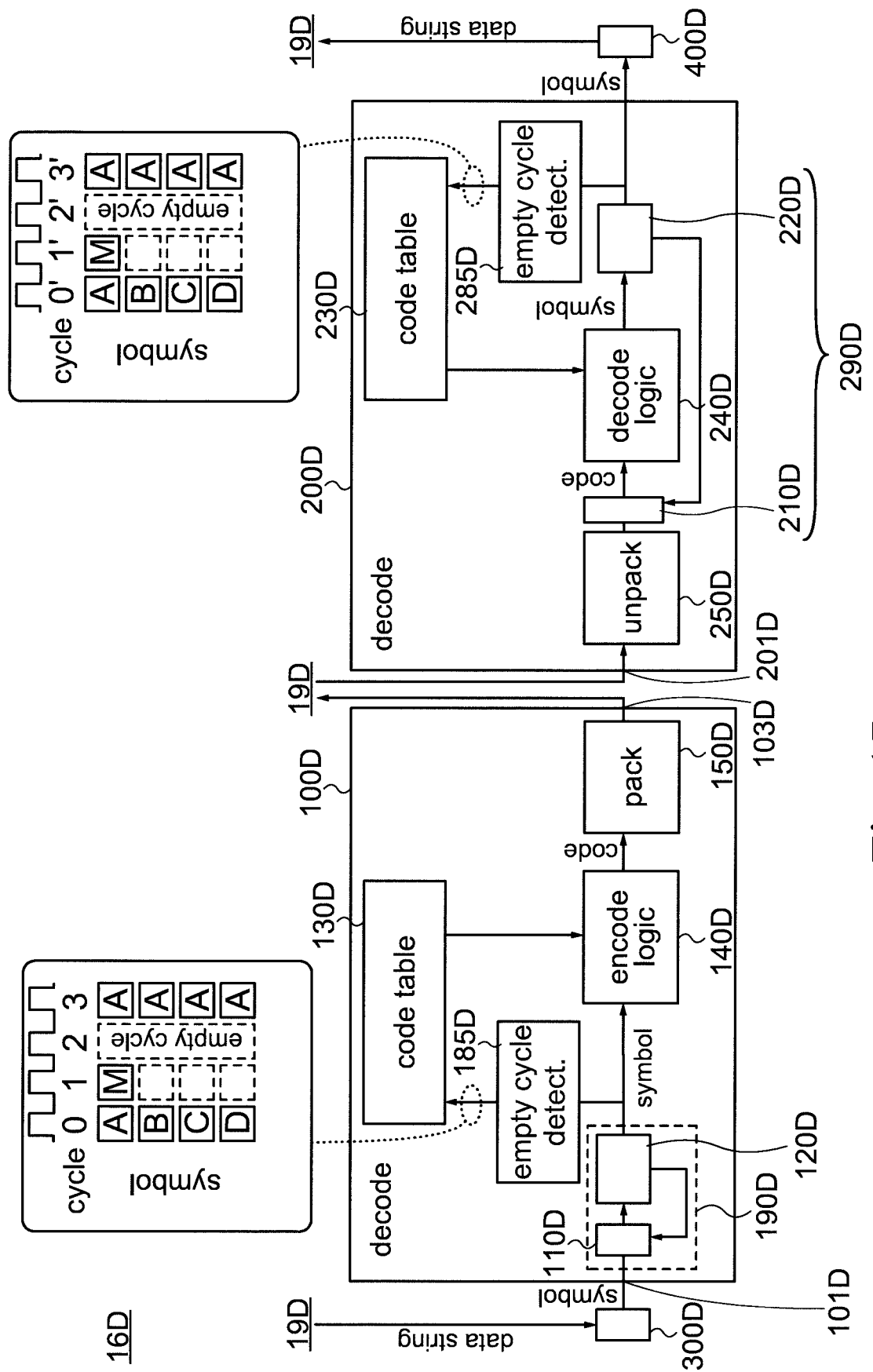
FIG. 17 is a block diagram showing a configuration of a compression/decompression circuit according to an embodiment.

FIG. 17 is a block diagram showing a configuration of a compression/decompression circuit according to an embodiment. The configuration of the compression/decompression circuit 16D shown in FIG. 17 is similar to the configuration of the compression/decompression circuit 16 shown in FIG. 2. However, the encoder 100D shown in FIG. 17 differs from the encoder 100 and decoder 200 shown in FIG. 2 in that a first empty cycle detecting section 185D (empty cycle detect.) is provided in the encoder 100D and a second empty cycle detecting section 285D (empty cycle detect.) is provided in the decoder 200D.

The first empty cycle detecting section 185D is provided between an encoding flow control section 190D (or a symbol-number calculating section 120D) and a code table updating section 130D. The first empty cycle detecting section 185D monitors the output of the encoding flow control section 190D (or the number of symbol calculating section 120D) and detects a cycle in which an input symbol is not input to the code table updating section 130D. That is, the first empty cycle detecting section 185D detects an empty cycle in which there are no input symbols.

Specifically, the first empty cycle detecting section 185D stores an accumulated value of the first data amount and an accumulated value of the number of input cycles. The first data amount is a data amount in an input data string before input symbols input in each cycle are compressed. The number of input cycles is the number of cycles in which input symbols are input. When the following (Equation 1) holds, the next cycle is detected as an empty cycle.

$$[\text{Accumulated value of the first data amount}] \geq [(\text{the number of input cycles})+1] \times 4 \quad \text{(Equation 1)}$$

The second empty cycle detecting section 285D is provided between a decoding flow control section 290D (or a number of symbol calculating section 220D) and a code table updating section 230D. Similar to the first empty cycle detecting section 185D, the second empty cycle detecting section 285D monitors the output of the decoding flow control section 290D (or the number of symbol calculating section 220D) and detects a cycle in which an output symbol is not input to the code table updating section 230D. That is, the second empty cycle detecting section 285D detects an empty cycle in which there are no outgoing symbols.

Specifically, the second empty cycle detecting section 285D stores an accumulated value of the second data amount and an accumulated value of the number of outputting cycle. The second data amount is a data amount in an output data string after output symbols input in each cycle are decompressed. The number of output cycles is the number of cycles in which output symbols are output. When the following (Equation 2) holds, the next cycle is detected as an empty cycle.

$$[\text{Accumulated value of the second data amount}] \geq [(\text{the number of output cycles})+1] \times 4 \quad \text{(Equation 2)}$$

[Configuration of Code Table Updating Section 130D]

Figure 18:
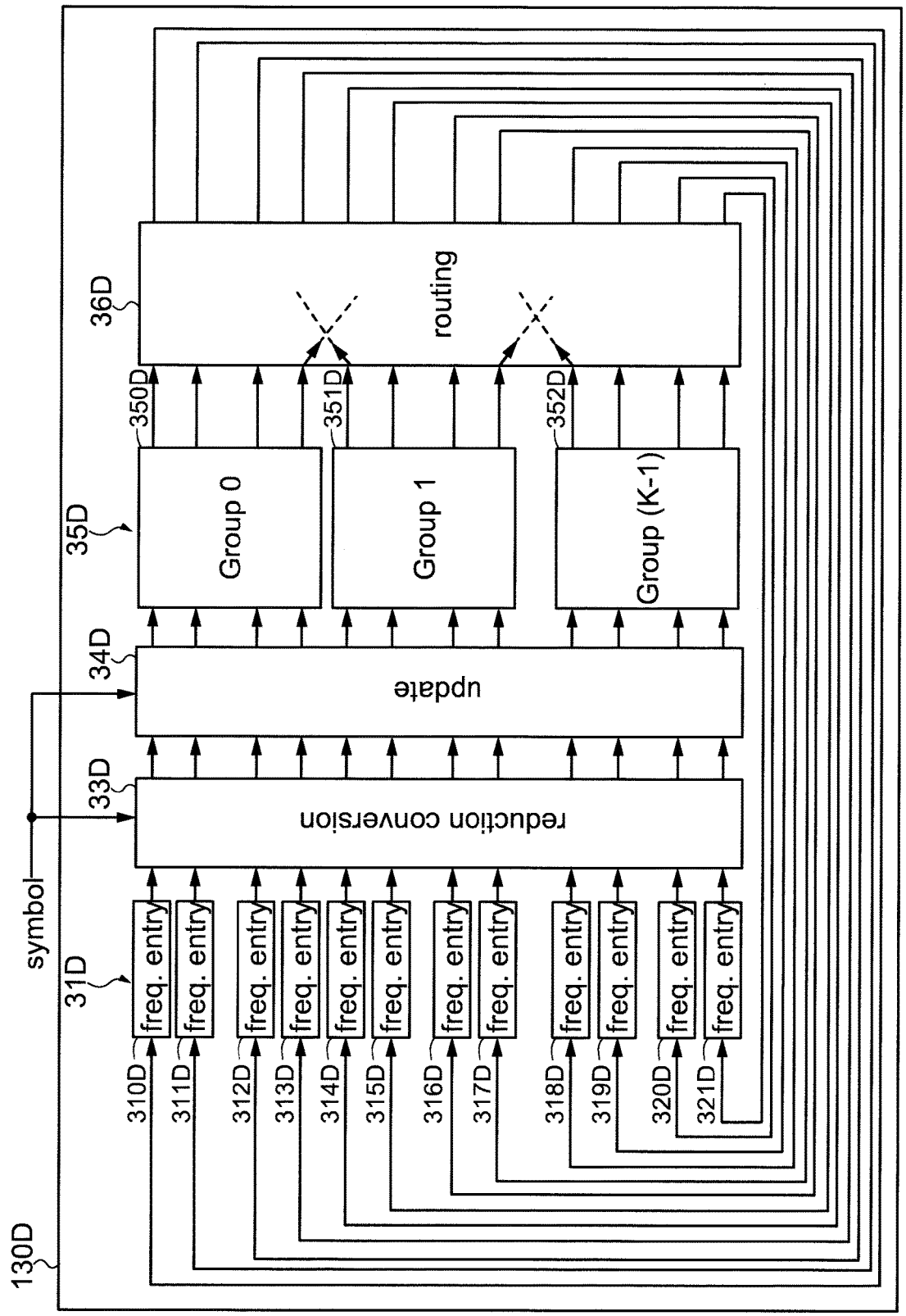
FIG. 18 is a block diagram showing a configuration of a code table updating section of a compression/decompression circuit according to an embodiment.

FIG. 18 is a block diagram showing a configuration of a code table updating section of a compression/decompression circuit according to an embodiment. The code table updating section 130D includes a frequency value reduction conversion section 33D (reduction conversion), a frequency value updating section 34D (update), a plurality of intra group rearrange sections 35D, and a routing section 36D (routing). The intra group rearrange section 35D includes an intra group 0 rearrange section 350D (Group 0), an intra group 1 rearrange section 351D (Group 1), and an intra group (K-1) rearrange section 352D (Group (K-1)). In the following description, the code table updating section 130D of the encoder 100D will be described, but the code table updating section 230D of the decoder 200D also has the same configuration.

Input symbols (symbol) and entry numbers are input to the frequency value reduction conversion section 33D. The entry number is a plurality of entry numbers configure a code table (e.g., the code table shown in FIG. 10). In the present embodiment, the entry number is referred to as "frequency entry 31D (freq. entry)". The total number of frequency entries 31D which configure the code table is, for example, N. The frequency entry 31D is input to the frequency value reduction conversion section 33D. For example, a flip-flop circuit holding the content of the frequency entry outputs the content of the frequency entry to the frequency value reduction conversion section 33D so that the input is realized. Flip-flop circuit may output the content of the frequency entry to a configuration in the code table updating section 130D and which is different from the frequency-value-reduction converting section 33D. That is, the flip-flop circuit may be arranged at any location in the loop process in the code table updating section 130D. The content of the frequency entry updated by the code table updating section 130D is written back to flip-flop circuit.

In FIG. 18, the order of the plurality of frequency entry 31D arranged in the direction perpendicular to coincides with the order in which the frequency entry 31D are arranged in the code table. Hereinafter, the N frequency entries 31D configuring the code table may be referred to as a frequency entry group 31D.

The frequency entry group 31D in the code table is divided into a plurality of groups (in this case, K groups) based on the order in which they are arranged in the code table. The group includes a plurality of consecutive frequency entries. In the example shown in FIG. 18, frequency entries 310D-313D belong to group 0. The frequency entries 314D-317D belong to the group 1. The group 1 is a group lower than the group 0. The frequency entries 318D-321D belong to the group (K-1). The group (K-1) is a lower group than the group 1.

The frequency value reduction conversion section 33D counts the number of input symbols input. When the counted number of input symbols is equal to or larger than a threshold value, the frequency value reduction conversion section 33D performs conversion for reducing the frequency value in each frequency entry 31D. Thereby, overflow of the frequency value can be avoided. The frequency value reduction conversion section 33D outputs the frequency entry 31D including the reduced frequency value to the frequency value update section 34D. If the number of input symbols is less than the threshold, the frequency value reduction conversion section 33D outputs the input frequency entry group 31D as it is to the frequency value update section 34D.

Frequency value update section 34D, among the frequency entry group 31D output from the frequency value reduction conversion section 33D, updates (e.g., increment) the frequency value of the frequency entry including the input symbol, and outputs the frequency entry to the intra group rearrange section 35D. More specifically, the frequency value update section 34D adds a first value (e.g., "1") to the frequency value of the frequency entry including the input symbol, and outputs the frequency entry to the intra group rearrange section 35D. The frequency value update section 34D outputs the frequency entry that does not include the input symbol among the frequency entry group 31D output from the frequency value reduction conversion section 33D to the intra group rearrange section 35D as it is.

The code table may further include empty frequency entries belonging to the group 2 (not shown) lower than the group 1. An empty frequency entry is a frequency entry which does not contain a symbol and a frequency value. That is, an empty cycle may occur. When the frequency entry group 31D in the code table does not include a frequency entry including an input symbol, the frequency value update section 34D changes the symbol included in the lowest frequency entry in the group 1 to an input symbol. The frequency value update section 34D may set the first value as the frequency value of the lowest frequency entry among the groups 1.

The code table may further include a frequency entry that includes an input symbol and does not include a frequency value, and an empty frequency entry that does not include a symbol and a frequency value. The frequency entry that contains input symbols and do not contain frequency value belong to the group 2 (middle group) below the group 1. The empty frequency entry belongs to the group 3 (not shown) (lower group) lower than the group 2. When the frequency entry group 31D does not include the frequency entry including the input symbol, the frequency value update section 34D adds the frequency entry including the input symbol to the highest level of the group 2 (middle group). Further, the frequency value update section 34D sorts the frequency entry at the highest level of the group 2 and also sorts lower levels of group 2 one by one to the lower level. The frequency value update section 34D may set, for example, the first value as the frequency value of the added frequency entry.

The intra group rearrange section 35D sorts the frequency entry group 31D output from the frequency value update section 34D for each group using the frequency value as a key. The intra group rearrange section 35D sorts the frequency entry group so that the frequency entry including the largest frequency value is located at the highest level and the frequency entry including the smallest frequency value is located at the lowest level among the frequency entry groups belonging to the corresponding group. The intra group rearrange section 35D maintains the frequency entry excluding each of the frequency entry including the maximum frequency value and the frequency entry including the minimum frequency value, for example, in original order before sorting. Alternatively, the intra group rearrange section 35D may replace the frequency entry at the highest level with the frequency entry including the maximum frequency value, replace the frequency entry at the lowest level with the frequency entry including the minimum frequency value, and maintain the location of the other frequency entries. The intra group rearrange section 35D may sort the frequency entry group in descending order of the frequency value.

In the code table updating section 130D, the intra group rearrange sections 35D are provided corresponding to the number of groups according to the frequency entry group 31D is divided. In the example shown in FIG. 18, the code table updating section 130D includes K intra group rearrange sections 350D, 351D, and 352D corresponding to the K groups, respectively.

More specifically, the intra group 0 rearrange section 350D sorts the frequency entries 310D to 313D belonging to the group 0 using the frequency values. The intra group 0 rearrange section 350D sorts the frequency entries 310D to 313D so that the frequency entry including the maximum frequency value is located at the highest level and the frequency entry including the minimum frequency value is located at the lowest level among the frequency entry 310D to 313D. The intra group 0 rearrange section 350D may sort the frequency entries 310D to 313D in descending order of the frequency values. The intra group 0 rearrange section 350D outputs the sorted frequency entries 310D to 313D to the routing section 36D.

Regarding the highest level group 0, since there is no group above the group 0, so no swapping of frequency entry between the group 0 and a group adjacent upper side to the group 0 is performed. Therefore, the intra group 0 rearrange section 350D may sorts the frequency entries 310D to 313D so that the frequency entry including the minimum frequency value is located at the lowest level. That is, in the sorted frequency entries 310D to 313D, the frequency entry including the maximum frequency value may not be located at the highest level.

The intra group 1 rearrange section 351D sorts the frequency entries 314D to 317D belonging to the group 1 using the frequency values. The intra group 1 rearrange section 351D sorts the frequency entries 314D to 317D so that the frequency entry including the maximum frequency value is located at the highest level and the frequency entry including the minimum frequency value is located at the lowest level among the frequency entries 314D to 317D. The intra group 1 rearrange section 351D may sort the frequency entries 314D to 317D in descending order of the frequency values. The intra group 1 rearrange section 351D outputs the sorted frequency entries 314D to 317D to the routing section 36D.

The intra group (K-1) rearrange section 352D sorts the frequency entries 318D to 321D belonging to the group (K-1) using the frequency values. The intra group (K-1) rearrange section 352D sorts the frequency entries 318D to 321D so that the frequency entry including the maximum frequency value is located at the highest level and the frequency entry including the minimum frequency value is located at the lowest level among the frequency entries 318D to 321D. The intra group (K-1) rearrange section 352D may sort the frequency entries 318D to 321D in descending order of the frequency values. The intra group (K-1) rearrange section 352D outputs the sorted frequency entries 318D to 321D to the routing section 36D.

Regarding the lowest level group (K-1), since there is no group below the group (K-1), so no swapping of frequency entry between the group (K-1) and a group adjacent lower side to the group (K-1) is performed. Therefore, the intra group (K-1) rearrange section 352D may sorts the frequency entries 318D to 321D so that the frequency entry including the maximum frequency value is located at the highest level. That is, in the sorted frequency entries 318D to 321D, the frequency entry including the minimum frequency value may not be located at the lowest level.

The routing section 36D swaps (exchanges) the frequency entries between adjacent groups. That is, the routing section 36D sorts the frequency entry in one group and the frequency entry in another group adjacent to the group. For example, the two sorted frequency entries are adjacent (consecutive) across groups.

Specifically, the routing section 36D exchanges the lowest frequency entry of the group 0 and the highest frequency entry of the group 1 adjacent to the lower level of the group 0 and outputs them. The routing section 36D exchanges the lowest frequency entry of the group 1 and the highest frequency entry of the group (e.g. the group (K-1)) adjacent to the lower level of the group 1 and outputs them. The routing section 36D outputs the other frequency entries those are not swapped as they are. The frequency entry exchanged by the routing section 36D is not limited to the above described example. For example, a frequency entry to be exchanged may be arbitrarily specified via an interface for rewriting the configuration of the routing section 36D. That is, operation of routing by the routing section 36D may be arbitrarily changed through this interface.

The frequency entry group 31D output by the routing section 36D and sorted (In-Place Sort) in a certain order is written back to the code table. The code table is used to encode the input symbols and further updated in response to the next symbol input. That is, the frequency entry group 31D output by the routing section 36D, when the next symbol input, is input to the frequency value reduction conversion section 33D. The code table updating section 130D updates the code table as described above for each symbol input.

According to the configuration described above, the same effect as that of the first embodiment can be obtained. Further, the frequency value reduction conversion section 33D determines whether the frequency value is reduced using the counted number of input symbols without waiting for updating the code table, and the frequency value is reduced in each frequency entry 31D when the number of input symbols is equal to or greater than the threshold value. The intra group rearrange section 35D and the routing section 36D performs local sorting of frequency entries for each group and swapping frequency entries between adjacent groups. Thus, the throughput of adaptive entropy coding can be improved and the circuit scale can be reduced. Further, when an empty cycle in which the frequency entry input to the code table updating section 130D is empty occurs by the circuit as described above, the empty cycle is detected and the sorting process is performed. By the above sort processing, the number of times of the sort processing can be increased. Therefore, the result of the sorting process approaches a more accurate sorting result. As a result, a code table with high encoding efficiency can be obtained.

While the present invention has been described with reference to the accompanying drawings, the present invention is not limited to the above embodiments, and can be appropriately modified without departing from the spirit of the present invention. For example, a compression/decompression circuit according to the present embodiment to which a person skilled in the art adds, deletes, or changes the design of components as appropriate is included in the scope of the present invention as long as the gist of the present invention is provided. Furthermore, the embodiments described above can be appropriately combined as long as there is no mutual inconsistency, and technical matters common to the embodiments are included in the embodiments even if they are not explicitly described.

Even if it is other function effects which differ from the function effect brought about by the mode of each above-mentioned embodiment, what is clear from the description in this description, or what can be easily predicted by the person skilled in the art is naturally understood to be brought about by the present invention.

What is claimed is:

1. A memory system comprising:
   a storage device and a memory controller configured to control the storage device and configured to encode an input data and configured to decode a compressed data, the memory controller including:
   an encoder configured to convert an input symbol to a codeword by using an encoding code table; and
   a decoder configured to convert the codeword to an output symbol by using a decoding code table, the encoder including:
- a first code table updating section configured to update the encoding code table in response to an appearance pattern of a symbol; and
- an encoding flow controlling section configured to control input to the first code table updating section by using a first data amount indicating a data amount of the input symbol, the first data amount being calculated based on the input symbol, the decoder including:
- a second code table updating section configured to update the decoding code table in response to an appearance pattern of a symbol; and
- a decoding flow controlling section configured to control input to the second code table updating section by using a second data amount indicating a data amount of the output symbol, the second data amount being calculated based on the output symbol in the same way as the calculation of the first data amount.

2. The memory system according to claim 1, wherein
the input symbol input to the encoder is a compressed symbol,
the first data amount is a data amount of the input symbol prior to be compressed, and
the second data amount is a data amount of the output symbol which are decompressed.

3. The memory system according to claim 2, wherein
the input symbol input to the encoder is compressed by a dictionary based compression.

4. The memory system according to claim 1, wherein
the encoding flow controlling section includes a first tentatively decoding section and a first number of symbol calculating section,
the first tentatively decoding section is configured to calculate data size in the same way as the output symbol output from the decoder is decoded,
the first number of symbol calculating section is configured to specify a location of the input symbol which is operated in next cycle based on data size calculated by the first tentatively decoding section,
the decoding flow controlling section includes a second tentatively decoding section and a second number of symbol calculating section,
the second tentatively decoding section is configured to calculate data size in the same way as the first tentatively decoding section, and
the second number of symbol calculating section is configured to specify a location of the output symbol which is operated in next cycle based on data size calculated by the second tentatively decoding section.

5. The memory system according to claim 1, wherein
the encoder further includes a first empty cycle detecting section arranged between the encoding flow controlling section and the first code table updating section, the first empty cycle detecting section being configured to detect a cycle without the input symbol,
the decoder further includes a second empty cycle detecting section arranged between the decoding flow controlling section and the second code table updating section, the second empty cycle detecting section being configured to detect a cycle without the output symbol.

6. A memory system comprising:
a storage device and a memory controller configured to control the storage device and configured to encode an input data and configured to decode a compressed data,
the memory controller including:
- an encoder configured to convert an input symbol to a codeword by using an encoding code table; and
- a decoder configured to convert the codeword to an output symbol by using a decoding code table, the encoder including:
- a first code table updating section configured to update the encoding code table in response to an appearance pattern of a symbol; and
- an encoding flow controlling section configured to control input to the first code table updating section by using a first data amount reflecting a data amount of the input symbol, the first data amount being estimated based on a first type indicating a type of the input symbol, the decoder including:
- a second code table updating section configured to update the decoding code table in response to an appearance pattern of a symbol; and
- a decoding flow controlling section configured to control input to the second code table updating section by using a second data amount reflecting a data amount of the output symbol, the second data amount being estimated based on a second type indicating a type of the codeword.

7. The memory system according to claim 6, wherein
the first type includes information indicating whether the input symbol input to the encoder is compressed or not,
the second type includes information indicating whether the output symbol obtained based on the codeword is compressed or not,
the first data amount is a data amount reflecting a data amount before the input symbol is compressed,
the second data amount is a data amount reflecting a data amount after the output symbol is decompressed.

8. The memory system according to claim 7, wherein
the input symbol input to the encoder is a compressed symbol by a dictionary based compression.

9. The memory system according to claim 6, wherein
the encoding flow controlling section includes a first approximately calculating section and a number of symbol calculating section,
the first approximately calculating section is configured to determine whether the input symbol is compressed or not, set the first data amount of the input symbol to a first value in a case where the input symbol is determined as compressed symbol, and specify a location of the input symbol which is operated in next cycle based on the first value,
the decoding flow controlling section includes a second approximately calculating section and a number of codeword calculating section,
the second approximately calculating section is configured to determine whether the output symbol is compressed or not, set the second data amount of the output symbol to a second value which is the same value as the first value in a case where the output symbol converted from the codeword is determined as compressed symbol, and specify an output location of the output symbol which is output in next cycle based on the second value.

10. The memory system according to claim 6, wherein
the decoder further includes an entry number extracting section configured to extract an entry number from the codeword output from the decoding flow controlling section, and configured to input the entry number to the second code table updating section,
the second code table updating section is configured to update the decoding code table based on the entry number.

11. The memory system according to claim 10, wherein the encoder further includes:
- an encoding logic section configured to convert the input symbol output from the encoding flow controlling section to the codeword based on the encoding code table; and
- a first delay buffer between the encoding flow controlling section and the encoding logic section, the first delay buffer being configured to delay the input symbol input, the decoder further includes:
- a decoding logic section configured to convert the codeword output from the decoding flow controlling section to the output symbol based on the decoding code table; and
- a second delay buffer between the decoding flow controlling section and the decoding logic section, the second delay buffer being configured to delay the codeword input.

12. The memory system according to claim 11, wherein the number of cycle delayed by the first delay buffer is the same as the number of cycle delayed by the second delay buffer.

13. The memory system according to claim 11, wherein the number of cycle delayed by the first delay buffer is smaller by one cycle than the number of cycle delayed by a latency in the first code table updating section, the number of cycle delayed by the second delay buffer is smaller by one cycle than the number of cycle delayed by a latency in the second code table updating section.

14. The memory system according to claim 1, wherein a plurality of the codeword converted from a plurality of the input symbol are output from the encoder within one cycle.

15. The memory system according to claim 9, further comprising a dictionary based compression section configured to output the input symbol to the encoder,
wherein
the dictionary based compression section is configured to compress a first symbol string in a case where the first symbol string input to the dictionary based compression section matches a second symbol string previously input by a length of minimum matching length or more, and
the first approximately calculating section is configured to set the first value to the minimum matching length
the second approximately calculation section is configured to set the second value to the minimum matching length.

* * * * *